(12) United States Patent
Zhang et al.

(10) Patent No.: US 11,115,054 B2
(45) Date of Patent: Sep. 7, 2021

(54) POLAR CODE ENCODING METHOD AND APPARATUS

(71) Applicant: Huawei Technologies Co., Ltd., Shenzhen (CN)

(72) Inventors: Gongzheng Zhang, Hangzhou (CN); Huazi Zhang, Hangzhou (CN); Rong Li, Hangzhou (CN); Lingchen Huang, Hangzhou (CN); Yunfei Qiao, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 142 days.

(21) Appl. No.: 16/688,100

(22) Filed: Nov. 19, 2019

(65) Prior Publication Data

US 2020/0083908 A1 Mar. 12, 2020

Related U.S. Application Data

(63) Continuation of application No. PCT/CN2018/100255, filed on Aug. 13, 2018.

(30) Foreign Application Priority Data

Aug. 11, 2017 (CN) .......................... 201710687568.9

(51) Int. Cl.
  *H03M 13/00* (2006.01)
  *H03M 13/13* (2006.01)
  *G06F 7/24* (2006.01)

(52) U.S. Cl.
  CPC .............. *H03M 13/13* (2013.01); *G06F 7/24* (2013.01); *H03M 13/612* (2013.01)

(58) Field of Classification Search
  CPC .. H03M 13/13; H03M 13/612; H03M 13/033; G06F 7/24; H04L 1/00; H04L 1/0041; H04L 1/0045; H04L 1/0057
  See application file for complete search history.

(56) References Cited

U.S. PATENT DOCUMENTS 9,742,440 B2 *  8/2017  El-Khamy ........ H03M 13/6368
2010/0050044 A1 *  2/2010  Kuri ...................... H04L 1/0057
                                                                        714/752

(Continued)

FOREIGN PATENT DOCUMENTS

CN      102122966 A      7/2011
CN      104079370 A      10/2014
CN      106027068 A      10/2016

OTHER PUBLICATIONS

NTT DOCOMO, "Sequence design of Polar codes," 3GPP TSG RAN WG1 Meeting #89, R1-1708489, Hangzhou, China, May 15-19, 2017, 6 pages.
Huawei et al., "Nested sequence for Polar code," 3GPP TSG RAN WG1 NR Ad-Hoc#2, R1-1710000, Qingdao, China, Jun. 27-30, 2017, 3 pages.

(Continued)

*Primary Examiner* — Albert Decady
*Assistant Examiner* — Enamul M Kabir
(74) *Attorney, Agent, or Firm* — Slater Matsil, LLP

(57) ABSTRACT

This application provides a polar code encoding method and apparatus. The method includes: obtaining, by a sending device, a sequence corresponding to a required mother code length; obtaining, by the sending device, a to-be-encoded bit; and performing, by the sending device, polar code encoding on the to-be-encoded bit by using the sequence corresponding to the required mother code length, to obtain an encoded bit, where the sequence is generated based on a basic sequence, and a length of the basic sequence is less than the mother code length.

11 Claims, 9 Drawing Sheets

(56) References Cited

U.S. PATENT DOCUMENTS

| | | | |
|---|---|---|---|
| 2010/0257427 A1* | 10/2010 | Xu | H03M 13/6362 |
| | | | 714/752 |
| 2015/0194987 A1* | 7/2015 | Li | H03M 13/13 |
| | | | 714/752 |
| 2015/0358113 A1* | 12/2015 | Callard | H04L 1/0041 |
| | | | 714/776 |
| 2015/0381208 A1* | 12/2015 | Li | H03M 13/6561 |
| | | | 714/755 |
| 2016/0013887 A1* | 1/2016 | Shen | H04L 1/0045 |
| | | | 375/295 |
| 2016/0285479 A1* | 9/2016 | El-Khamy | H03M 13/616 |
| 2016/0380763 A1* | 12/2016 | Ahn | H04W 12/02 |
| | | | 380/270 |
| 2017/0019214 A1* | 1/2017 | Shen | H04L 1/0067 |
| 2017/0222757 A1* | 8/2017 | Huang | H03M 13/13 |
| 2017/0331590 A1* | 11/2017 | Wu | H04L 1/1819 |
| 2018/0026663 A1* | 1/2018 | Wu | H03M 13/6362 |
| | | | 714/776 |
| 2018/0034587 A1* | 2/2018 | Kim | H03M 13/2792 |

OTHER PUBLICATIONS

He, G. et al., "Beta-expansion: A Theoretical Framework for Fast and Recursive Construction of Polar Codes," 2017 IEEE Global Communications Conference (GLOBECOM 2017), Singapore, Dec. 4-8, 2017, 8 pages.

Qualcomm, Inc., "Sequence construction of Polar codes for control channel," 3GPP TSG-RAN WG1 NR Ad-Hoc#2, R1-1711218, Qingdao, China, Jun. 27-30, 2017, 18 pages.

Accelercomm, "On the storage of polar code sequences," 3GPP TSG RAN WG1 NR Ad-Hoc Meeting #2, R1-1710843, Qingdao, China, Jun. 27-30, 2017, 8 pages.

\* cited by examiner

POLAR CODE ENCODING METHOD AND APPARATUS

CROSS-REFERENCE TO RELATED APPLICATIONS

This application is a continuation of International Application No. PCT/CN2018/100255, filed on Aug. 13, 2018, which claims priority to Chinese Patent Application No. 201710687568.9, filed on Aug. 11, 2017. The disclosures of the aforementioned applications are hereby incorporated by reference in their entireties.

TECHNICAL FIELD

This application relates to the channel encoding field, and more specifically, to a polar code encoding method and apparatus.

BACKGROUND

As the most basic radio access technology, channel encoding plays a crucial role in ensuring reliable data transmission. In an existing wireless communications system, channel encoding is usually performed by using a Turbo code, a low-density parity-check (LDPC) code, and a polar code. The Turbo code cannot support information transmission at an excessively low code rate or an excessively high code rate. For medium or short packet transmission, the Turbo code and the LDPC code cannot achieve ideal performance with a limited code length due to encoding and decoding features of the Turbo code and the LDPC code. In terms of implementation, the Turbo code and the LDPC code have relatively high calculation complexity in an encoding and decoding process. The polar code has been theoretically proved to be a good code that can achieve a Shannon capacity and have relatively low encoding and decoding complexity, and therefore is increasingly widely applied.

However, with rapid evolution of wireless communications systems, some new features will occur in future communications systems (such as 5G). For example, the most typical three communication scenarios include enhanced mobile Internet (eMBB), massive machine connection communication (mMTC), and ultra-reliable and low latency communications (URLLC). These communication scenarios have higher requirements on encoding and decoding performance of the polar code.

However, performance of the polar code at a present stage is not ideal in an application process, and needs to be further improved.

SUMMARY

This application provides a polar code encoding method and apparatus, to improve performance of a polar code.

According to a first aspect, this application provides a polar code encoding method. The method includes: obtaining, by a sending device, a sequence corresponding to a required mother code length, where the sequence is generated based on a basic sequence, and a length of the basic sequence is less than the mother code length; obtaining, by the sending device, a to-be-encoded bit; and performing, by the sending device, polar code encoding on the to-be-encoded bit by using the sequence, to obtain an encoded bit.

Herein, "a sequence corresponding to a required mother code length" is a sequence that is equal to the mother code length and that is actually used during the polar code encoding.

In a possible implementation, the performing, by the sending device, polar code encoding on the to-be-encoded bit by using the sequence, to obtain an encoded bit includes: determining, by the sending device, an information bit index set based on the sequence; and performing, by the sending device, the polar code encoding on the to-be-encoded bit based on the information bit index set, to obtain the encoded bit.

According to a second aspect, this application provides a decoding method. The method includes: obtaining, by a receiving device, a sequence corresponding to a required mother code length and a to-be-decoded bit; and decoding, by the receiving device, the to-be-decoded bit by using the sequence corresponding to the required mother code length, to obtain a decoded bit, where the sequence corresponding to the required mother code length is generated based on a basic sequence, and a length of the basic sequence is less than the mother code length.

According to a third aspect, this application provides a polar code encoding apparatus. The apparatus includes: an obtaining unit, configured to obtain a sequence corresponding to a required mother code length and a to-be-encoded bit, where the sequence is generated based on a basic sequence, and a length of the basic sequence is less than the mother code length; and an encoding unit, configured to perform polar code encoding on the to-be-encoded bit by using the sequence that corresponds to the required mother code length and that is obtained by the obtaining unit, to obtain an encoded bit.

According to a fourth aspect, this application provides a polar code decoding apparatus. The apparatus includes: an obtaining unit, configured to obtain a to-be-decoded bit and a sequence corresponding to a required mother code length, where the sequence corresponding to the required mother code length is generated based on a basic sequence, and a length of the basic sequence is less than the mother code length; and a decoding unit, configured to decode the to-be-decoded bit by using the sequence that corresponds to the required mother code length and that is obtained by the obtaining unit, to obtain a decoded bit.

With reference to any one of the first aspect to the fourth aspect, in a first possible implementation: the basic sequence is a first sequence whose length is N, the sequence is a sequence whose length is 2N and that is obtained by sorting reliability values of the first sequence and reliability values of a second sequence in ascending order, sequence numbers of N polarized channels in the first sequence are arranged in a predetermined order, and the predetermined order is different from an order of polarization weights of the N polarized channels; the reliability values of the N polarized channels arranged in the predetermined order in the first sequence respectively correspond to polarization weight values of the N polarized channels that are arranged in ascending order, and indexes of the polarized channels corresponding to the first sequence are 0, . . . , and N−1; and the reliability values of N polarized channels arranged in the predetermined order in the second sequence are obtained by adding a first difference to the polarization weight value of each polarized channel in the first sequence, and index numbers of the polarized channels corresponding to the second sequence are N, . . . , and 2N−1.

In the first possible implementation:

a polarization weight of an $i^{th}$ polarized channel in the first sequence is $W_i = \Sigma_{j=0}^{n-1} B_j * (\beta)^j$, and the first difference is $\Delta W_n = \beta^n$; or a polarization weight of an $i^{th}$ polarized channel in the first sequence is $W_i=\Sigma_{j=0}^{n-1}B_j{}^*(\beta_j)^j$, and the first difference is $\Delta W_n=(\beta_n)^n$; or a polarization weight of an $i^{th}$ polarized channel in the first sequence is $W_i=\Sigma_{j=0}^{n-1}B_j{}^*(2^{j*\alpha_j}+b_j)^{\gamma_j}$, and the first difference is $\Delta W_n=(2^{n*\alpha_n}+b_n)^{\gamma_n}$; or a polarization weight of an $i^{th}$ polarized channel in the first sequence is $W_i=\Sigma_{j=0}^{n-1}B_j{}^*(\beta^j+a^*\theta^j)$, and the first difference is $\Delta W_n=(\beta)^n+a^*(\theta)^n$; or a polarization weight of an $i^{th}$ polarized channel in the first sequence is $W_i=\Sigma_{j=0}^{n-1}B_j{}^*(\beta^j+a^*\theta^j)$, and the first difference is $\Delta W_n=(\beta)^n+a^*(\theta)^n$; or a polarization weight of an $i^{th}$ polarized channel in the first sequence is $W_i=\Sigma_{j=0}^{n-1}B_j{}^*((\beta_j)^j+a_j{}^*(\theta_j)^j)$, and the first difference is $\Delta W_n=(\beta_n)^n+a_n{}^*(\theta_n)^n$, where i is an index of the polarized channel, i is an integer greater than or equal to 0 and less than N $i\triangleq B_{n-1}B_{n-2}\ldots B_0$, $B_j\in\{0,1\}$, $j\in\{0,1,\ldots,n-1\}$, $n=\log_2(N)$, $\beta$ and $\theta$ are fixed values whose value ranges are $[0,2]$, $\alpha$ and $\gamma$ are fixed values whose value ranges satisfy $\alpha\times\gamma\in[0,2]$, b is a fixed value whose value range is $[-1,1]$, and a is a fixed value whose value range is $[-1,1]$.

With reference to any one of the first aspect to the fourth aspect, in a second possible implementation: the basic sequence includes a first sequence whose length is N and a second sequence whose length is N, the first sequence and the second sequence are different sequences, the sequence is a sequence whose length is 2N and that is obtained by sorting reliability values of the first sequence and reliability values of the second sequence in ascending order, sequence numbers of N polarized channels in the first sequence are arranged in a first order, sequence numbers of N polarized channels in the second sequence are arranged in a second order, and the first order is different from the second order; the reliability values of the N polarized channels arranged in the first order in the first sequence respectively correspond to polarization weight values of the N polarized channels that are arranged in ascending order, and indexes of the polarized channels corresponding to the first sequence are $0,\ldots,$ and $N-1$; and the reliability values of the N polarized channels arranged in the second order in the second sequence are obtained by adding a second difference to a polarization weight value of each polarized channel in the second sequence, and index numbers of the polarized channels corresponding to the second sequence are $N,\ldots,$ and $2N-1$.

In the second possible implementation:
a polarization weight of an $i^{th}$ polarized channel in the second sequence is $W_i=\Sigma_{j=0}^{n-1}B_j{}^*(\beta)^j$, and the second difference is $\Delta W_n=\beta^n$; or a polarization weight of an $i^{th}$ polarized channel in the second sequence is $W_i=\Sigma_{j=0}^{n-1}B_j{}^*(\beta_j)^j$, and the second difference is $\Delta W_n=(\beta_n)^n$; or a polarization weight of an $i^{th}$ polarized channel in the second sequence is $W_i=\Sigma_{j=0}^{n-1}B_j{}^*(\beta_{B_n,B_{n-1},B_{n-2},\ldots,B_{j+1}})^j$, and the second difference is $\Delta W_n(s)=(\beta_s)^j$, where $s=B_n$, indicating a segment sequence number; and $B_j$ is 0 or 1 that indicates a channel index in binary; or a polarization weight of an $i^{th}$ polarized channel in the second sequence is $W_i=\Sigma_{j=0}^{n-1}B_j{}^*(\beta_{B_n,B_{n-1},B_{n-2},\ldots,B_0})^j$, and the second difference is $\Delta W_n(i)=(\beta_i)^n$; or a polarization weight of an $i^{th}$ polarized channel in the second sequence is $W_i=\Sigma_{j=0}^{n-1}B_j{}^*(2^{j*\alpha}+b)^\gamma$, and the second difference is $\Delta W_n=(2^{n*\alpha}+b)^\gamma$; or a polarization weight of an $i^{th}$ polarized channel in the second sequence is $W_i=\Sigma_{j=0}^{n-1}B_j{}^*(2^{j*\alpha_j}+b_j)^{\gamma_j}$, and the second difference is $\Delta W_n=(2^{n*\alpha_n}+b_n)^{\gamma_n}$; or a polarization weight of an $i^{th}$ polarized channel in the second sequence is $$W_i=\sum_{j=0}^{n-1}B_j*\left(2^{j*\alpha_{B_n,B_{n-1},B_{n-2},\ldots,B_{j+1}}}+b_{B_n,B_{n-1},B_{n-2},\ldots,B_{j+1}}\right)^{\gamma_{B_n,B_{n-1},B_{n-2},\ldots,B_{j+1}}},$$

and the second difference is $\Delta W_n(s)=(2^{n*\alpha_s}+b_s)^{\gamma_s}$; or
a polarization weight of an $i^{th}$ polarized channel in the second sequence is $$\sum_{j=0}^{n-1}B_j*\left(2^{j*\alpha_{B_n,B_{n-1},B_{n-2},\ldots,B_0}}+b_{B_n,B_{n-1},B_{n-2},\ldots,B_0}\right)^{\gamma_{B_n,B_{n-1},B_{n-2},\ldots,B_0}},$$

and the second difference is $\Delta W_n(i)=(2^{n*\alpha_i}+b_i)^{\gamma_i}$; or
a polarization weight of an $i^{th}$ polarized channel in the second sequence is $W_i=\Sigma_{j=0}^{n-1}B_j{}^*(\beta^j+a^*\theta^j)$, and the second difference is $\Delta W_n=(\beta)^n+a^*(\theta)^n$; or a polarization weight of an $i^{th}$ polarized channel in the second sequence is $W_i=\Sigma_{j=0}^{n-1}B_j{}^*((\beta_j)^j+a_j{}^*(\theta_j)^j)$, and the second difference is $\Delta W_n=(\beta_n)^n+a_n{}^*(\theta_n)^n$; or a polarization weight of an $i^{th}$ polarized channel in the second sequence is $$\sum_{j=0}^{n-1}B_j*$$

$$\left(2^{j*\alpha_{B_n,B_{n-1},B_{n-2},\ldots,B_{j+1}}}+b_{B_n,B_{n-1},B_{n-2},\ldots,B_{j+1}}\right)^{\gamma_{B_n,B_{n-1},B_{n-2},\ldots,B_{j+1}}},$$

and the second difference is $\Delta W_n=(\beta_s)^n+a_s{}^*(\theta_s)^n$; or
a polarization weight of an $i^{th}$ polarized channel in the second sequence is $$\sum_{j=0}^{n-1}B_j*\left((\beta_{B_n,B_{n-1},B_{n-2},\ldots,B_0})^j+\right.$$

$$\left.a_{\beta_{B_n,B_{n-1},B_{n-2},\ldots,B_0}}*(\theta_{\beta_{B_n,B_{n-1},B_{n-2},\ldots,B_0}})^j\right),$$

and the second difference is $\Delta W_n=(\beta_i)^n+a_i{}^*(\theta_i)^n$, where
i is an index of the polarized channel, i is an integer greater than or equal to N and less than $2N-1$, $i\triangleq B_nB_{n-1}B_{n-2}\ldots B_0$, $B_j\in\{0,1\}$, $j\in\{0,1,\ldots,n\}$, $n=\log_2(N)$, $\beta$ and $\theta$ are fixed values whose value ranges are $[0,2]$, $\alpha$ and $\gamma$ are fixed values whose value ranges satisfy $\alpha\times\gamma\in[0,2]$, $\alpha$ and $\gamma$ are fixed values whose value ranges satisfy $\alpha\times\gamma\in[0,2]$, b is a fixed value whose value range is $[-1,1]$, and a is a fixed value whose value range is $[-1,1]$.

In the second possible implementation:
a polarization weight of each channel corresponding to the first sequence is: $W_i=\Sigma_{j=0}^{n-1}B_j{}^*(\beta)^j$; or a polarization weight of each channel corresponding to the first sequence is: $W_i=\Sigma_{j=0}^{n-1}B_j{}^*(\beta_j)^j$; or a polarization weight of each channel corresponding to the first sequence is: $W_i=\Sigma_{j=0}^{n-1}B_j{}^*(\beta_{B_n,B_{n-1},B_{n-2},\ldots,B_{j+1}})^j$; or a polarization weight of each channel corresponding to the first sequence is: $W_i=\Sigma_{j=0}^{n-1}B_j{}^*(\beta_{B_n,B_{n-1},B_{n-2},\ldots,B_0})^j$; or a polarization weight of each channel corresponding to the first sequence is: $W_i=\Sigma_{j=0}^{n-1}B_j{}^*(2^{j*\alpha}+b)^\gamma$; or a polarization weight of each channel corresponding to the first sequence is: $W_i=\Sigma_{j=0}^{n-1}B_j*(2^{j*\alpha_j}+b_j)^{\gamma_j}$; or a polarization weight of each channel corresponding to the first sequence is:

$$\sum_{j=0}^{n-1}B_j*\left(2^{j*\alpha_{B_n,B_{n-1},B_{n-2},\ldots,B_{j+1}}}+b_{B_n,B_{n-1},B_{n-2},\ldots,B_{j+1}}\right)^{\gamma_{B_n,B_{n-1},B_{n-2},\ldots,B_{j+1}}};$$

or a polarization weight of each channel corresponding to the first sequence is:

$$\sum_{j=0}^{n-1}B_j*\left(2^{j*\alpha_{B_n,B_{n-1},B_{n-2},\ldots,B_0}}+b_{B_n,B_{n-1},B_{n-2},\ldots,B_0}\right)^{\gamma_{B_n,B_{n-1},B_{n-2},\ldots,B_0}};$$

or a polarization weight of each channel corresponding to the first sequence is: $W_i=\Sigma_{j=0}^{n-1}B_j*(\beta^j+a*\theta^j)$; or a polarization weight of each channel corresponding to the first sequence is: $W_i=\Sigma_{j=0}^{n-1}B_j*((\beta_j)^j+a_j*(\theta_j)^j)$; or a polarization weight of each channel corresponding to the first sequence is:

$$\sum_{j=0}^{n-1}B_j*\left(2^{j*\alpha_{B_n,B_{n-1},B_{n-2},\ldots,B_{j+1}}}+b_{B_n,B_{n-1},B_{n-2},\ldots,B_{j+1}}\right)^{\gamma_{B_n,B_{n-1},B_{n-2},\ldots,B_{j+1}}};$$

or a polarization weight of each channel corresponding to the first sequence is: $W_i=\Sigma_{j=0}^{n-1}B_j*((\beta_{B_n,B_{n-1},B_{n-2},\ldots,B_0})^j+a_{B_n,B_{n-1},B_{n-2},\ldots,B_0}*(\theta_{B_n,B_{n-1},B_{n-2},\ldots,B_0})^j)$, where i is an index of the polarized channel, i is an integer greater than or equal to 0 and less than N, $i\triangleq B_nB_{n-1}B_{n-2}\ldots B_0$, $B_j\in\{0,1\}$, $j\in\{0,1,\ldots,n\}$, $n=\log_2(N)$, $\beta$ and $\theta$ are fixed values whose value ranges are [0, 2], $\alpha$ and $\gamma$ are fixed values whose value ranges satisfy $\alpha\times\gamma\in[0,2]$, $\alpha$ and $\gamma$ are fixed values whose value ranges satisfy $\alpha\times\gamma\in[0,2]$, b is a fixed value whose value range is [−1, 1], and a is a fixed value whose value range is [−1, 1].

With reference to any one of the first aspect to the fourth aspect, in a third possible implementation: the basic sequence includes a first sequence whose length is N and a second sequence whose length is N, the sequence is a sequence whose length is 2N and that is obtained by sorting polarization weight values of the first sequence and polarization weight values of the second sequence in ascending order; indexes of polarized channels corresponding to the first sequence are 0, . . . , and N−1, and index numbers of polarized channels corresponding to the second sequence are N, . . . , and 2N−1; and a polarization weight calculation manner of the first sequence is different from a polarization weight calculation manner of the second sequence.

In the third possible implementation:

any one of the following is used for the polarization weight calculation manner of the first sequence and the polarization weight calculation manner of the second sequence:

a polarization weight calculation manner: $W_i=\Sigma_{j=0}^{n-1}B_j*(\beta)^j$; or a polarization weight calculation manner: $W_i=\Sigma_{j=0}^{n-1}B_j*(\beta_j)^j$; or a polarization weight calculation manner: $W_i=\Sigma_{j=0}^{n-1}B_j*(\beta_{B_n,B_{n-1},B_{n-2},\ldots,B_{j+1}})^j$; or a polarization weight calculation manner: $W_i=\Sigma_{j=0}^{n-1}B_j*(\beta_{B_n,B_{n-1},B_{n-2},\ldots,B_0})^j$, where an index of an $i^{th}$ polarized channel is i, $i\triangleq B_{n-1}B_{n-2}\ldots B_0$, $B_j\in\{0,1\}$, $j\in\{0,1,\ldots,n-1\}$, $n=\log 2(2N)$, and $\beta$ is a fixed value.

According to a fifth aspect, this application provides a device. The device includes one or more processors, one or more memories, and one or more transceivers (each transceiver includes a transmitter and a receiver). The transmitter or the receiver sends and receives a signal by using an antenna. The memory is configured to store a computer program instruction (or code). The processor is configured to execute the instruction stored in the memory, and when the instruction is executed, the processor performs the encoding method according to any one of the first aspect or the possible implementations of the first aspect.

According to a sixth aspect, this application provides a device. The device includes one or more processors, one or more memories, and one or more transceivers (each transceiver includes a transmitter and a receiver). The transmitter or the receiver sends and receives a signal by using an antenna. The memory is configured to store a computer program instruction (or code). The processor is configured to execute the instruction stored in the memory, and when the instruction is executed, the processor performs the decoding method according to any one of the second aspect or the possible implementations of the second aspect.

According to a seventh aspect, this application provides a computer-readable storage medium. The computer-readable storage medium stores an instruction, and when the instruction is run on a computer, the computer is enabled to perform the method according to any one of the first aspect or the possible implementations of the first aspect.

According to an eighth aspect, this application provides a computer-readable storage medium (product). The computer-readable storage medium stores an instruction, and when the instruction is run on a computer, the computer is enabled to perform the method according to any one of the second aspect or the possible implementations of the second aspect.

According to a ninth aspect, this application provides a computer program. The computer program includes an instruction, and when the instruction is run on a computer, the computer is enabled to perform the method according to any one of the first aspect or the possible implementations of the first aspect.

According to a tenth aspect, this application provides a computer program. The computer program includes an instruction, and when the instruction is run on a computer, the computer is enabled to perform the method according to any one of the second aspect or the possible implementations of the second aspect.

According to an eleventh aspect, this application provides a chip (or a chip system), including a processor, configured to perform the method according to any one of the first aspect, the second aspect, and the possible implementations of the first aspect and the second aspect.

When the method according to any one of the first aspect, the second aspect, and the possible implementations of the first aspect and the second aspect is implemented by using software, the chip may further include a memory, or the chip is connected to an external memory, the memory is configured to store a computer program, and the processor is configured to invoke the computer program from the memory and run the computer program, so that a communications device in which the chip is installed performs the method according to any one of the first aspect, the second aspect, and the possible implementations of the first aspect and the second aspect.

In another implementation, the chip may alternatively be one or more circuits, configured to perform the method according to any one of the first aspect, the second aspect, and the possible implementations of the first aspect and the second aspect.

The chip may alternatively be a combination of the foregoing two manners. To be specific, the chip includes a circuit, a processor, and a memory. A part of the method according to any one of the first aspect, the second aspect, and the possible implementations of the first aspect and the second aspect is performed by using the circuit, and the other part is performed by invoking the computer program in the memory by the processor.

It should be understood that the communications device herein may be the sending device according to the first aspect or the receiving device according to the second aspect.

According to a twelfth aspect, this application provides an encoding apparatus. The encoding apparatus has a function of implementing behavior of the sending device according to any one of the first aspect and the possible designs of the first aspect. The function may be implemented by using hardware, or may be implemented by hardware executing corresponding software. The hardware or the software includes one or more modules corresponding to the foregoing function.

In a possible design, when some or all of the functions are implemented by using hardware, the encoding apparatus includes: an input interface circuit, configured to obtain a to-be-encoded bit and a sequence corresponding to a required mother code length; a logic circuit, configured to perform the encoding method according to any one of the first aspect and the possible designs of the first aspect; and an output interface circuit, configured to output a bit obtained after polar code encoding.

Optionally, the encoding apparatus may be a chip or an integrated circuit.

In a possible design, when some or all of the functions are implemented by using software, the encoding apparatus includes: a memory, configured to store a program; and a processor, configured to execute the program stored in the memory, and when the program is executed, the encoding apparatus may implement the encoding method according to any one of the first aspect and the possible designs of the first aspect.

In a possible design, when some or all of the functions are implemented by using software, the encoding apparatus includes a processor. A memory configured to store a program is located outside the encoding apparatus. The processor is connected to the memory by using a circuit/wire, and is configured to read and execute the program stored in the memory.

According to an eleventh aspect, this application provides a decoding apparatus. The decoding apparatus has a function of implementing behavior of the receiving device according to any one of the second aspect and the possible designs of the second aspect. The function may be implemented by using hardware, or may be implemented by hardware executing corresponding software. The hardware or the software includes one or more modules corresponding to the foregoing function.

In a possible design, when some or all of the functions are implemented by using hardware, the decoding apparatus includes: an input interface circuit, configured to obtain a to-be-decoded bit and a sequence corresponding to a required mother code length; a logic circuit, configured to perform the decoding method according to any one of the second aspect and the possible designs of the second aspect; and an output interface circuit, configured to output a decoded bit.

Optionally, the decoding apparatus may be a chip or an integrated circuit.

In a possible design, when some or all of the functions are implemented by using software, the decoding apparatus includes: a memory, configured to store a program; and a processor, configured to execute the program stored in the memory, and when the program is executed, the encoding apparatus may implement the decoding method according to any one of the second aspect and the possible designs of the second aspect.

In a possible design, when some or all of the functions are implemented by using software, the decoding apparatus includes a processor. A memory configured to store a program is located outside the encoding apparatus. The processor is connected to the memory by using a circuit/wire, and is configured to read and execute the program stored in the memory.

Optionally, the memory may be a physically independent unit, or may be integrated with the processor.

According to the polar code encoding method and apparatus and the polar code decoding method and apparatus that are provided in the embodiments of this application, the sequence corresponding to the required mother code length can be obtained based on any existing basic sequence, thereby improving encoding and decoding flexibility of a polar code.

DETAILED DESCRIPTION OF ILLUSTRATIVE EMBODIMENTS

The following describes technical solutions of this application with reference to accompanying drawings.

Figure 1:
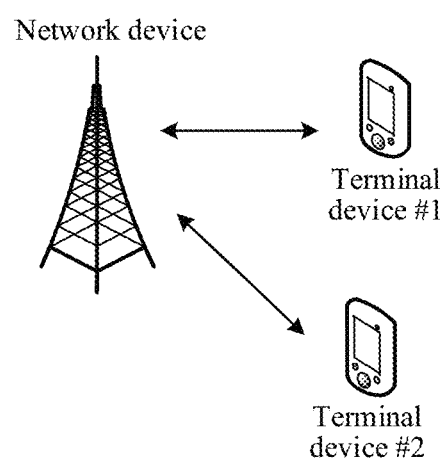
FIG. 1 shows a wireless communications system to which an embodiment of this application is applicable.

FIG. 1 shows a wireless communications system to which an embodiment of this application is applicable. The wireless communications system may include at least one network device, and the network device communicates with one or more terminal devices. The network device may be a base station, or may be a device obtained after integrating a base station and a base station controller, or may be another device having a similar communication function.

A wireless communications system mentioned in the embodiments of this application includes but is not limited to: a narrowband Internet of things (NB-IoT) system; a long term evolution (LTE) system; three major application scenarios of a next-generation 5G mobile communications system, namely, enhanced mobile broadband (eMBB), ultra-reliable and low latency communications (URLLC), and enhanced massive machine connection communication (eMTC); or a new communications system that may appear in future.

A terminal device in the embodiments of this application may include various handheld devices, in-vehicle devices, wearable devices, and computing devices that have a wireless communication function or other processing devices connected to a wireless modem. The terminal may be a mobile station (MS), a subscriber unit, a cellular phone, a smartphone, a wireless data card, a personal digital assistant (PDA) computer, a tablet computer, a wireless modem, a handheld device (handset), a laptop computer, a machine type communication (MTC) terminal, or the like.

In FIG. 1, the network device communicates with the terminal by using a wireless technology. When the network device sends a signal, the network device is a sending device, and when the network device receives a signal, the network device is a receiving device. Similarly, when the terminal sends a signal, the terminal is a sending device, and when the terminal receives a signal, the terminal is a receiving device.

Figure 2:
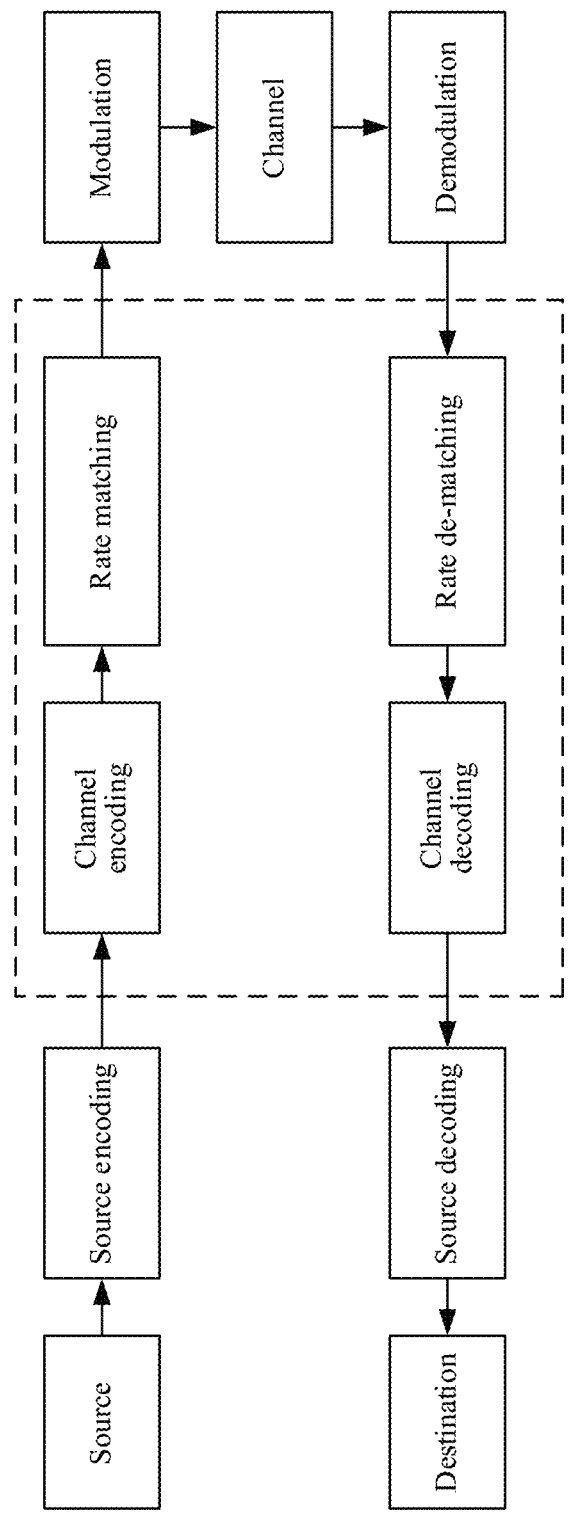
FIG. 2 is a basic flowchart of performing communication by using a wireless technology.

FIG. 2 is a basic flowchart of performing communication by using a wireless technology. At a transmit end, a message generated by a source is sent over a channel successively through source encoding, channel encoding, rate matching, and modulation. At a receive end, after a signal is received, the obtained message is sent to a destination successively through demodulation, rate de-matching, channel decoding, and source decoding.

Channel encoding and decoding is one of core technologies in the wireless communications field, and a performance improvement of the channel encoding and decoding can directly improve network coverage and a user transmission rate. Currently, a polar code is a channel encoding technology that can be theoretically proved to achieve a Shannon limit and that has a practical encoding and decoding capability with linear complexity. The construction core of the polar code is processing of "channel polarization". On an encoding side, different reliabilities are presented for sub-channels by using an encoding method. When a code length is continuously increased, some channels tend towards noiseless channels whose capacity is close to 1, and the other channels tend towards pure noisy channels whose capacity is close to 0. A channel whose capacity is close to 1 is selected to directly transmit information, to approach the channel capacity.

A feature of this phenomenon is exactly applied to an encoding policy of the polar code, a noiseless channel is used to transmit information useful for a user, and a pure noisy channel is used to transmit agreed information or does not transmit information. The polar code is also a linear block code, an encoding matrix (also referred to as a generator matrix) of the polar code is $F_N$, and an encoding process is $x_1^N = \mu_1^N \cdot F_N$, where $\mu_1^N = (\mu_1, \mu_2, \ldots, \mu_N)$ is a binary row vector having a length of N (namely, a code length), $N = 2^n$, and n is a positive integer. $F_N$ is an N×N matrix, and $F_N = F_2^{\otimes (\log_2 N)}$. $F_2^{\otimes (\log_2 N)}$ is defined as a Kronecker (Kronecker) product of $\log 2^N$ matrices $F_2$, where $$F_2 = \begin{bmatrix} 1 & 0 \\ 1 & 1 \end{bmatrix}.$$

The addition and multiplication operations in the foregoing formulas are all addition and multiplication operations in the binary Galois field.

In the encoding process of the polar code, some bits in $u_1^N$ are used to carry information, and are referred to as an information bit set. A set of indexes of the bits is denoted by A. The other bits are set to fixed values pre-agreed on by the receive end and the transmit end, and are referred to as a fixed bit set or a frozen bit set (frozen bits). A set of indexes of the bits is represented by using a complementary set $A^C$ of A. The encoding process of the polar code is equivalent to $x_1^N = u_A F_N(A) \oplus u_{A^C} F_N(A^C)$. Herein, $F_N(A)$ is a submatrix obtained by rows corresponding to the indexes in the set A in $F_N$. $F_N(A^C)$ is a submatrix obtained by rows corresponding to the indexes in the set $A^C$ in $F_N$. $u_A$ is the information bit set in $u_1^N$, and a quantity of information bits is K. $u_{A^C}$ is the fixed bit set in $u_1^N$, a quantity of fixed bits is (N-K), and the fixed bits are known bits. The fixed bits are usually set to 0. However, the fixed bits may be randomly set, provided that the fixed bits are pre-agreed on by the receive end and the transmit end. Therefore, an encoding output of the polar code may be simplified as $x_1^N = u_A \cdot F_N(A)$. Herein, $u_A$ is the information bit set in $u_1^N$; $u_A$ is a row vector having a length of K. In other words, |A|=K; a symbol ∥ represents a quantity of elements in a set; K is a size of an information block; $F_N(A)$ is a submatrix obtained by the rows corresponding to the indexes in the set A in the matrix $F_N$; and $F_N(A)$ is an N×N matrix.

A construction process of the polar code is a selection process of the set A, and determines performance of the polar code. The construction process of the polar code is usually: determining, based on a mother code length N, that there are N polarized channels in total that respectively correspond to N rows of the encoding matrix, calculating reliabilities of the polarized channels, using sequence numbers (or indexes) of the first K polarized channels having higher reliabilities as elements in the set A, and using sequence numbers corresponding to the remaining (N-K) polarized channels as elements in the set $A^C$ of sequence numbers of the fixed bits. The set A determines locations of the information bits, and the set $A^C$ determines locations of the fixed bits.

A polar code encoding method provided in the embodiments of this application is below described in detail.

First, a basic processing procedure of polar code encoding is described.

Figure 3:
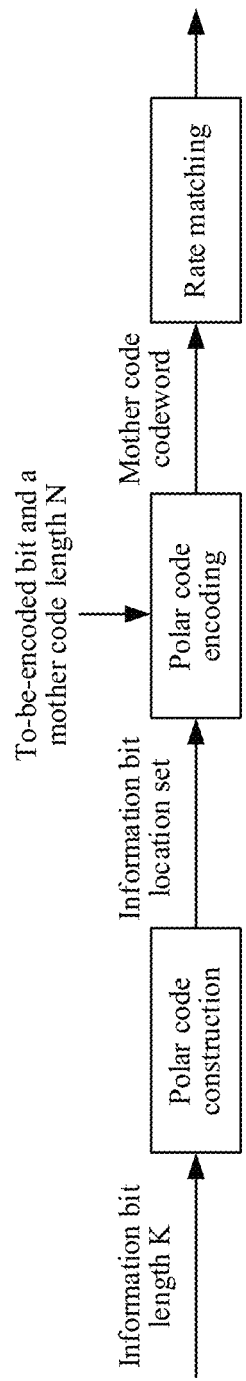
FIG. 3 is a schematic block diagram of a polar code encoding processing procedure.

FIG. 3 is a schematic block diagram of a polar code encoding processing procedure. As shown in FIG. 3, before a polar code is encoded, an information bit index set I is selected first by using a polar code construction module. The polar code construction module may obtain an order of reliabilities of polarized channels based on online calculation or based on table reading; then select, based on an information bit length K, K polarized channels having the highest reliabilities as information bit locations; and use a remaining bit as a fixed bit. Usually, in an online table reading manner, a sequence corresponding to a maximum mother code length may be obtained through offline calculation and a table may be stored. During polar code encoding, a sequence corresponding to a currently required mother code length is read, based on a current mother code length, from the sequence corresponding to the maximum mother code length. Finally, an information bit location set is determined in the sequence based on the information bit length, to complete a process of constructing the polar code.

The reliability of the polarized channel may be measured by using a plurality of parameters. The parameter is, for example, an error probability, a channel capacity, or a polarization weight, or may be another parameter capable of measuring the reliability of the polarized channel.

A method for constructing, based on a polarization weight calculation formula, a sequence corresponding to a mother code length according to an embodiment of this application is described below. As a metric of a reliability of a subchannel, a polarization weight is irrelevant to a channel. To be specific, a PW value of any polarized channel is unique. An original polarization weight calculation formula is $W_i = \sum_{j=0}^{n-1} B_j * \beta^j$, where $i = B_{n-1} B_{n-2} \ldots B_0$, and $B_j$ is a binary representation item of i. In an example, $\beta = 2^{1/4}$. Sorting polarized channels based on the PWs has the following characteristics: A sequence required by any mother code may be uniquely and directly generated based on an order of the PW values (an order of all the polarized channels), and different mother code sequences generated based on polarization weight values are nested. The "nested" means that a short code sequence is included in a long code sequence, the long code sequence may be obtained by using the short code sequence, and the short code sequence may be obtained by using the long code sequence.

The polarization weight calculation formula is also referred to as a PW formula. Three types of formulas that are described respectively correspond to three PW formulas. The three PW formulas are respectively that there is only an $\beta^j$ item, a constant item is included, and another power item is included.

A first-type formula is an original PW formula, has the simplest form, and correspondingly requires the fewest parameters. A second-type formula and a third-type formula separately increase accuracy of a calculated polarized channel reliability by adding a constant item and another item, thereby improving decoding performance of the polar code.

A first variation form of each type of formula means that a parameter of the type of formula is related to only a quantity of bits of a current operation, namely, j, to be specific, a level of a polar code polarization process, to represent a difference between polarization effects of various levels, thereby improving the accuracy of the calculated polarized channel reliability.

Parameters in a second variation form of each type of formula are related to a level of the parameter, and also related to a segment, namely, $B_{n-1}, B_{n-2}, \ldots, B_{j+1}$ of the level, to represent a case in which orders in different segments of the level are inconsistent, thereby further improving the accuracy of the calculated polarized channel reliability.

The first-type PW formula:
a basic form: $W_i = \sum_{j=0}^{n-1} B_j * (\beta)^j$
a variation form 1: $W_i = \sum_{j=0}^{n-1} B_j * (\beta_j)^j$
a variation form 2: $W_i = \sum_{j=0}^{n-1} B_j * (\beta_{B_{n-1}, B_{n-2}, \ldots, B_{j+1}})^j$
a variation form 3: $W_i = \sum_{j=0}^{n-1} B_j * (\beta_{B_{n-1}, B_{n-2}, \ldots, B_0})^j$, where
$\beta$ is a fixed value whose value range is [0, 2].

The second-type PW formula:
a basic form: $W_i = \sum_{j=0}^{n-1} B_j * (2^{j*\alpha} + b)^\gamma$
a variation form 1: $W_i = \sum_{j=0}^{n-1} B_j * (2^{j*\alpha_j} + b_j)^{\gamma_j}$ a variation form 2: $W_i =$ $$\sum_{j=0}^{n-1} B_j * \left(2^{j*\alpha_{B_{n-1}, B_{n-2}, \ldots, B_{j+1}}} + b_{B_{n-1}, B_{n-2}, \ldots, B_{j+1}}\right)^{\gamma_{B_{n-1}, B_{n-2}, \ldots, B_{j+1}}}$$

a variation form 3: $W_i =$ $$\sum_{j=0}^{n-1} B_j * \left(2^{j*\alpha_{B_{n-1}, B_{n-2}, \ldots, B_0}} + b_{B_{n-1}, B_{n-2}, \ldots, B_0}\right)^{\gamma_{B_{n-1}, B_{n-2}, \ldots, B_0}},$$

where
$\alpha$ and $\gamma$ are fixed values whose value ranges satisfy $\alpha \times \gamma \in [0,2]$, and b is a fixed value whose value range is [−1, 1].

The third-type PW formula:
a basic form: $W_i = \sum_{j=0}^{n-1} B_j * (\beta^j + a*\theta^j)$
a variation form 1: $W_i = \sum_{j=0}^{n-1} B_j * ((\beta_j)^j + a_j*(\theta_j)^j)$
a variation form 2: $W_i = \sum_{j=0}^{n-1} B_j * ((\beta_{B_{n-1}, B_{n-2}, \ldots, B_{j+1}})^j + a_{B_{n-1}, B_{n-2}, \ldots, B_{j+1}} * (\theta_{B_{n-1}, B_{n-2}, \ldots, B_{j+1}})^j)$
a variation form 3: $W_i = \sum_{j=0}^{n-1} B_j * ((\beta_{B_{n-1}, B_{n-2}, \ldots, B_0})^j + a_{B_{n-1}, B_{n-2}, \ldots, B_0} * (\theta_{B_{n-1}, B_{n-2}, \ldots, B_0})^j)$, where
$\beta$ and $\theta$ are fixed values whose value ranges are [0, 2], and a is a fixed value whose value range is [−1, 1].

In the foregoing various types of formulas, i is an index of the polarized channel, i is an integer greater than or equal to 0 and less than N, $i \triangleq B_{n-1} B_{n-2} \ldots B_0$, $B_j \in \{0,1\}$, $j \in \{0,1,\ldots,n-1\}$, $n = \log_2(N)$, and N is a mother code length.

A polar code encoding method and a polar code decoding method provided in the embodiments of this application are described below.

Figure 4:
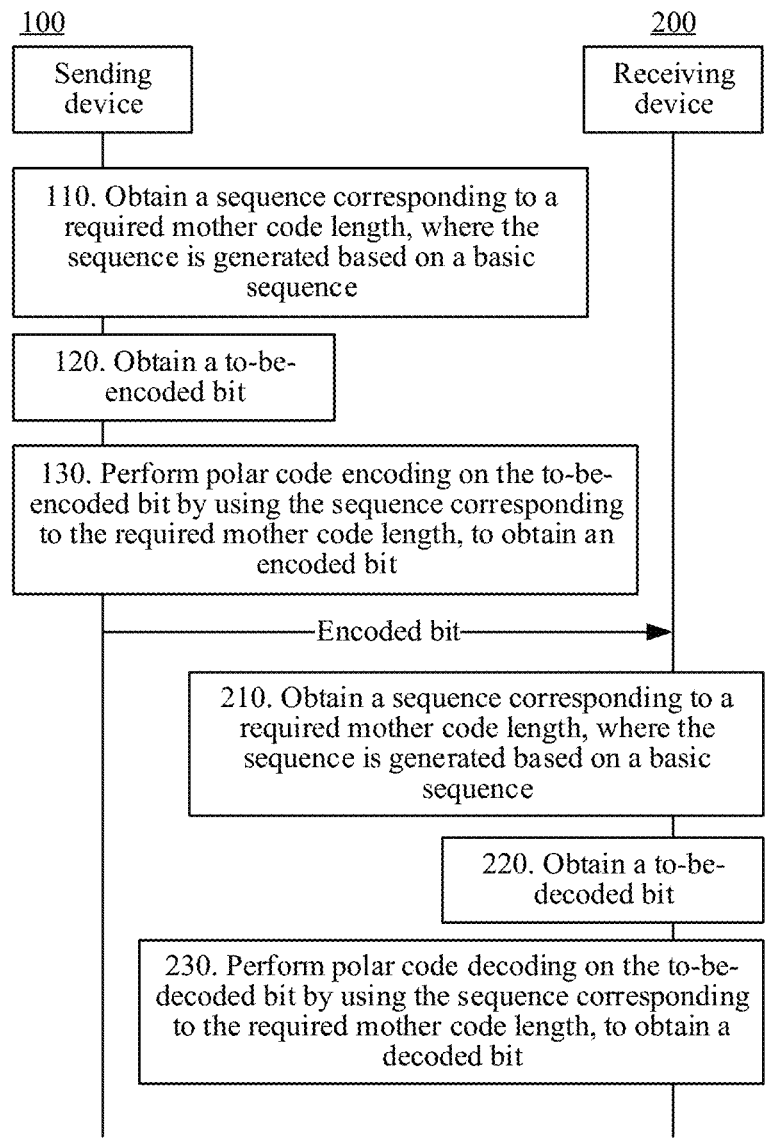
FIG. 4 is a schematic interaction diagram of a polar code encoding method 100 according to an embodiment of this application.

FIG. 4 is a schematic interaction diagram of a polar code encoding method 100 and a polar code decoding method 200 according to an embodiment of this application.

110: A sending device obtains a sequence corresponding to a required mother code length, where the sequence is generated based on a basic sequence, and a length of the basic sequence is less than the mother code length.

In this embodiment of this application, the sequence corresponding to the required mother code length may be generated based on the basic sequence, and the length of the basic sequence is less than the mother code length. Assuming that a length of a sequence corresponding to a required mother code length during polar code encoding is equal to $N_o$, if a basic sequence whose length is less than $N_o$ is known, the sequence corresponding to the required mother code length may be obtained by using the basic sequence.

Any short basic sequence is extended to a long sequence according to a cross sorting rule that is of two segments of polarized channels and that is generated based on PWs. It is assumed that the sequence corresponding to the required mother code length is divided into an upper half segment and a lower half segment. Any basic sequence is used as the upper half segment, after PW values for a same code length are sorted, the PW values are given to the polarized channels of the basic sequence that are sorted according to a same rule. To be specific, a reliability metric value is obtained for each polarized channel, and each PW value plus a PW difference is given to the lower half segment of polarized channels. The polarized channels are sorted based on the obtained reliability metric values, to obtain the sequence corresponding to the required mother code length. A parameter P in PW calculation is not necessarily unique, and may be related to a location of each polarized channel.

120: The sending device obtains a to-be-encoded bit.

130: The sending device performs polar code encoding on the to-be-encoded bit by using the sequence corresponding to the required mother code length, to obtain an encoded bit.

After obtaining the sequence corresponding to the required mother code length, the sending device determines an information bit index set based on the sequence corresponding to the required mother code length, and then performs the polar code encoding on the to-be-encoded bit based on the information bit index set, to obtain the encoded bit.

The information bit index set is selected, to be specific indexes of the first K polarized channels having the highest reliabilities are selected from indexes of $N_o$ polarized channels included in the sequence corresponding to the required mother code length, as locations for placing information bits during the polar code encoding. A process of selecting the information bit index set may be the same as that in the prior art.

The encoded bit is sent to a receiving device. The polar code decoding method 200 performed by the receiving device is shown in 4.

210: Obtain a sequence corresponding to a required mother code length, where the sequence corresponding to the required mother code length is generated based on a basic sequence, and a length of the basic sequence is less than the mother code length.

220: Obtain a to-be-decoded bit.

230: Decode the to-be-decoded bit by using the sequence corresponding to the required mother code length, to obtain a decoded bit.

Manners of obtaining the sequence corresponding to the required mother code length by the sending device and the receiving device are the same. Uniform descriptions are provided below.

It is assumed that the required mother code length is equal to $N_o$. To be specific, the sequence corresponding to the required mother code length includes indexes (also referred to as sequence numbers) of $N_o$ polarized channels. The No indexes and the $N_o$ polarized channels are in a one-to-one correspondence. The $N_o$ indexes in the sequence are sorted based on reliabilities of the $N_o$ polarized channels. Without loss of generality, the sequence may be arranged in ascending order of the reliabilities of the $N_o$ polarized channels, or may be arranged in descending order of the reliabilities of the $N_o$ polarized channels.

There are the following three manners for generating, based on the basic sequence, the sequence corresponding to the required mother code length, to be specific, extending a short code to a long code.

Manner 1: Extension Based on PW Values

For any basic sequence $\{Q_1, Q_2, \ldots, Q_N\}$ arranged in ascending order of reliabilities. PW values for a same code length are successively given, in ascending order of the PW values $\{W_{S_1}, W_{S_2}, \ldots, W_{S_N}\}$, to polarized channels at corresponding locations of the basic sequence. Therefore, a reliability value of each polarized channel of the basic sequence is:

$$\text{Rel}(Q_i) = W_{S_i}, i=1,2,\ldots,N$$

A length of the sequence corresponding to the required mother code length is 2N, and the reliability value of each polarized channel of the basic sequence plus a PW difference $\Delta W_n$ is used as a reliability of a polarized channel in the lower half segment corresponding to the sequence corresponding to the required mother code length, to be specific, $$\text{Rel}(Q_i+N) = W_{S_i} + \Delta W_n, i=1,2,\ldots,N$$

The sequence corresponding to the required mother code length is obtained by sorting the reliability values in ascending order.

Manner 2: Extension Based on an Indication Sequence

The cross rule of the upper and lower segments when a short code is extended to a long code may be obtained based on the PW values or the sorting, and an extension rule may be represented by using an indication sequence. Therefore, the basic sequence is extended to a long sequence based on a predetermined indication sequence.

The indication sequence may be obtained in a PW value extension manner. The PW values of the sequence whose length is 2N are calculated and sorted, and the cross rule of the upper and lower half segments of N polarized channels is obtained based on the PW values. For example, the indication sequence is:

$$\text{bitVec} = \{0,0,0,1,\ldots,0,1,1,1\}$$

0 indicates that a polarized channel herein belongs to the upper half segment, namely, 0 to N−1; and 1 indicates that a polarized channel herein is in the lower half segment, namely, N to 2N−1.

Based on the given indication sequence, based on the order in the basic sequence, a location of 0 in bitVec is replaced with a sorting number in the upper half segment, to be specific, a sequence number of a polarized channel in the basic sequence; and a location of 1 is replaced with a sorting number in the lower half segment, to be specific, N plus a sequence number of a polarized channel in the basic sequence. An obtained sequence is the extended sequence.

The indication sequence may be obtained by using a sequence obtained through extension in manner 1. For example, sorting obtained based on the PW values of the sequence whose length is 2N (16) includes N (8) polarized channels in the upper half segment and the lower half segment, and a cross order thereof is represented as an indication sequence, to obtain an indication sequence shown in Table 1, where $\Delta W_4 = 2^{(3/4)} = 1.681793$.

TABLE 1

| | Segment number | | | | | | | |
|---|---|---|---|---|---|---|---|---|
| | 0 | 0 | 0 | 0 | 0 | 0 | 0 | 0 |
| PW8 | 0 | 1 | 1.189207 | 1.414214 | 2.189207 | 2.414214 | 2.603421 | 3.603421 |
| | Segment number | | | | | | | |
| | 1 | 1 | 1 | 1 | 1 | 1 | 1 | 1 |
| PW8 + $\Delta W_4$ | 1.681793 | 2.681793 | 2.871 | 3.096006 | 3.871 | 4.096006 | 4.285214 | 5.285214 |

After sorting is performed based on the PW values, an obtained indication sequence is:

bitVec=[0000100011101111]

It is assumed that respective orders in the upper and lower half segments are as follows:

Seq8_0=[01234567] and

Seq8_1=[01243567]+8

During extension, only 0 in the indication sequence needs to be successively replaced with a sequence number of a sorting number in the upper half segment, and 1 is replaced with a sequence number of a sorting number in the lower half segment, to obtain an extended sequence:

Seq16=[0123845691012711131415]

The indication sequence corresponding to the required mother code length may be pre-stored, and during extension, the extension is performed based on the indication sequence. Alternatively, the indication sequence may be calculated online.

In Manner 1 and Manner 2, the sequence corresponding to the required mother code length may be obtained by performing extension once. However, if a long code sequence is at least twice longer than a short code sequence, the sequence corresponding to the required mother code length may be obtained by performing the same extension twice or a plurality of times. For example, if a length of the basic sequence is 16, to obtain a sequence whose length is 64, the basic sequence may be extended once to obtain a sequence whose length is 32, and then the sequence whose length is 32 is extended to a sequence whose length is 64.

Manner 3: Multi-Level Extension

Figure 5:
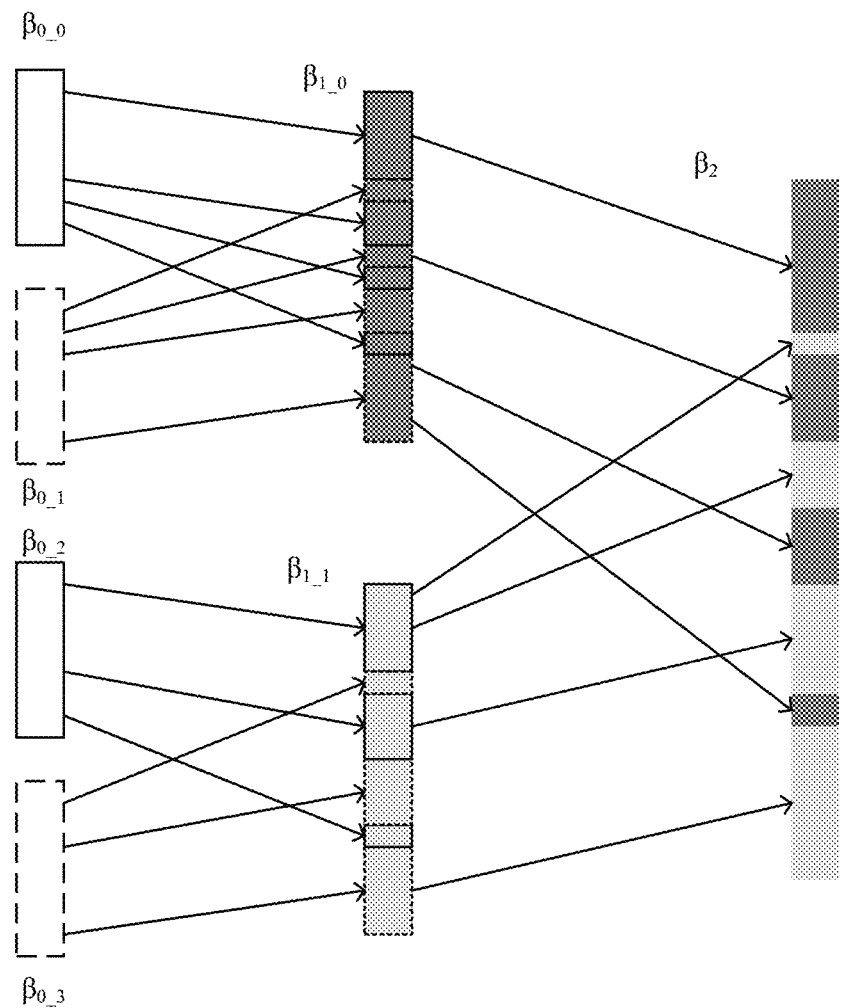
FIG. 5 is a schematic diagram of obtaining a long sequence through multi-level extension by using a short sequence.

The sequence corresponding to the required mother code length may be obtained in a multi-level extension manner. FIG. 5 is a schematic diagram of two-level extension. For example, to obtain a sequence whose mother code length is 64, first level extension may be performed by using a basic sequence whose length is 16, to obtain two intermediate sequences whose length is 32, and then second level extension is performed on the intermediate sequences whose length is 32, to obtain a sequence whose length is 64. Specifically, referring to FIG. 5, a segment 0_0 and a segment 0_1 are used as upper and lower segments, and the segment 0_0 and the segment 0_1 are extended to a segment 1_0 through first level extension; a segment 0_2 and a segment 0_3 are used as upper and lower segments, and the segment 0_2 and the segment 0_3 are extended to a segment 1_1 through first level extension; and then the segment 1_0 and the segment 1_1 are used as upper and lower segments, and the segment 1_0 and the segment 1_1 are extended to a segment 2 through second level extension. The segment 2 is used as a final sequence. In the multi-level extension process, a PW value in each segment may be calculated by using a same parameter value β or different parameter values β. For example, parameters of the segment 0_0, the segment 0_1, the segment 0_2, the segment 0_3, the segment 1_0, the segment 1_1, and the segment 2 are respectively $\beta_{0\_0}$, $\beta_{0\_1}$, $\beta_{0\_2}$, $\beta_{0\_3}$, $\beta_{1\_0}$, $\beta_{1\_1}$, and $\beta_2$. Values of these parameters may be the same or different.

It is assumed that the obtained sequence whose length is 2N is generated by using a first sequence whose length is N and a second sequence whose length is N. Polarized channels in the first sequence and the second sequence may be sorted in ascending order of reliability values of the corresponding polarized channels. The basic sequence may be a sequence, and the sequence corresponding to the required mother code length is obtained in a symmetric extension manner by using the basic sequence. For example, the basic sequence is a first sequence whose length is N, the sequence that corresponds to the required mother code length and whose length is 2N is a sequence whose length is 2N and that is obtained by sorting reliability values of the first sequence and reliability values of a second sequence in ascending order. The basic sequence may be a PW sequence, or may be a sequence obtained by using another method.

In an implementation, the first sequence may be a PW sequence, to be specific, a sequence obtained through PW value sorting.

For example, a polar code whose length is 2N is divided into an upper sub-code and a lower sub-code, each sub-code has its internal sorting, and a difference between PW values of the two sub-codes indicates a mutual cross-relationship of polarized channel sorted in the two sub-codes. For example, it is assumed that a polarization weight of the upper sub-code is $$W_i = \sum_{j=0}^{n-1} B_j * 2^{j*\frac{1}{4}},$$

where i=0,1, . . . , N−1; a polarization weight of the lower sub-code is $$W_i = \Delta W_n + \sum_{j=0}^{n-1} B_j * 2^{j*\frac{1}{4}},$$

where i=N, N+1, . . . , 2N−1; and a difference is $$\Delta W_n = 2^{n*\frac{1}{4}} = \left(2^{\frac{1}{4}}\right)^n,$$

where n=log$_2$(N). For example, if N=8, n=3.

The basic sequence is a PW sequence, and a reliability value of each polarized channel is a PW value of the polarized channel. For example, an order in a basic sequence whose code length is 8 is: Seq8=[0 1 2 4 3 5 6 7], and corresponding PW values are shown in Table 2.

TABLE 2

| PW value | 0 | 1 | 1.189207 | 1.414214 | 2.189207 | 2.414214 | 2.603421 | 3.603421 |
|---|---|---|---|---|---|---|---|---|
| Polarized channel sequence number | 0 | 1 | 2 | 4 | 3 | 5 | 6 | 7 |

During extension, a corresponding PW value plus a difference $\Delta W_4 = 2^{(3/4)} = 1.681793$ is given to a corresponding polarized channel in the lower half segment, so that a reliability value of each polarized channel is shown in Table 3.

TABLE 3

| | Polarized channel sequence number | | | | | | | |
|---|---|---|---|---|---|---|---|---|
| | 0 | 1 | 2 | 3 | 4 | 5 | 6 | 7 |
| PW8 | 0 | 1 | 1.189207 | 2.189207 | 1.414214 | 2.414214 | 2.603421 | 3.603421 |
| | Polarized channel sequence number | | | | | | | |
| | 8 | 9 | 10 | 11 | 12 | 13 | 14 | 15 |
| PW8 + $\Delta W_4$ | 1.681793 | 2.681793 | 2.871 | 3.871 | 3.096006 | 4.096006 | 4.285214 | 5.285214 |

A sequence obtained by sorting reliability values of the 16 channels is:

Seq16=[0 1 2 4 8 3 5 6 9 10 12 7 11 13 14 15]

In another implementation, the first sequence may not be a PW sequence, to be specific, may be any sequence other than the PW sequence. In this case, there may be two cases. One is symmetrical extension, and the other is non-symmetrical extension.

First Case: Symmetrical Extension

In this extension manner, the reliability values of the second sequence are obtained by adding a fixed first difference to the reliability values of the first sequence, so that internal sorting of the second sequence is consistent with internal sorting of the first sequence. Therefore, this extension manner is referred to as symmetrical extension.

In the first case, the basic sequence is a first sequence whose length is N, the sequence that corresponds to the required mother code length and whose length is 2N is a sequence whose length is 2N and that is obtained by sorting reliability values of the first sequence and reliability values of a second sequence in ascending order. The basic sequence may be a PW sequence, or may be a sequence obtained by using another method. Sequence numbers of N polarized channels in the first sequence are arranged in a predetermined order, and the predetermined order is different from an order of polarization weights of the N polarized channels corresponding to the first sequence whose mother code length is N. The reliability values of the N polarized channels arranged in the predetermined order in the first sequence respectively correspond to polarization weight values of the N polarized channels that are arranged in ascending order, and indexes of the polarized channels corresponding to the first sequence are 0, ..., and N−1. The reliability values of N polarized channels arranged in the predetermined order in the second sequence are obtained by adding a first difference to the polarization weight value of each polarized channel in the first sequence, and index numbers of the polarized channels corresponding to the second sequence are N, ..., and 2N−1.

For example, the basic sequence (the first sequence) is a general sequence, and an order in the basic sequence is different from that in a PW sequence. For example, a first sequence whose length is 8 is:

Seq8=[0 1 2 3 4 5 6 7]

Using a PW value calculated in the basic form ($\beta = 1/4$ is used) of the first-type PW formula as an example, PW values that are of polarized channels corresponding to a PW sequence whose length is also 8 and that are obtained through calculation are given to the corresponding polarized channels of the first sequence in the sorting order in the first sequence, and the reliability values of the first sequence are shown in Table 4.

TABLE 4

| PW value | 0 | 1 | 1.189207 | 1.414214 | 2.189207 | 2.414214 | 2.603421 | 3.603421 |
|---|---|---|---|---|---|---|---|---|
| Polarized channel sequence number | 0 | 1 | 2 | 3 | 4 | 5 | 6 | 7 |

The reliability value of each polarized channel corresponding to the first sequence plus the first difference $\Delta W4 = 2^{(3/4)} = 1.681793$ is given to a corresponding polarized channel in the lower half segment, so that a reliability of each channel is shown in Table 5.

TABLE 5

| | Polarized channel sequence number | | | | | | | |
|---|---|---|---|---|---|---|---|---|
| | 0 | 1 | 2 | 3 | 4 | 5 | 6 | 7 |
| PW8 | 0 | 1 | 1.189207 | 1.414214 | 2.189207 | 2.414214 | 2.603421 | 3.603421 |
| | Polarized channel sequence number | | | | | | | |
| | 8 | 9 | 10 | 11 | 12 | 13 | 14 | 15 |
| PW8 + $\Delta W_4$ | 1.681793 | 2.681793 | 2.871 | 3.096006 | 3.871 | 4.096006 | 4.285214 | 5.285214 |

An extended sequence obtained after sorting is:

Seq16=[0 1 2 3 8 4 5 6 9 10 11 7 12 13 14 15]

A polarization weight calculation manner of the first sequence may use the basic form and the first variation form of each type of PW formula. In this case, the first difference is a fixed value.

If a polarization weight of an $i^{th}$ polarized channel in the first sequence is $W_i = \sum_{j=0}^{n-1} B_j * (\beta)^j$, and the first difference is $\Delta W_n = \beta^n$; or if a polarization weight of an $i^{th}$ polarized channel in the first sequence is $W_i = \sum_{j=0}^{n-1} B_j * (\beta_j)^j$, and the first difference is $\Delta W_n = (\beta_n)^n$; or if a polarization weight of an $i^{th}$ polarized channel in the first sequence is $W_i = \sum_{j=0}^{n-1} B_j * (2^{j*\alpha}+b)^\gamma$, and the first difference is $\Delta W_n = (2^{n*\alpha}+b)^\gamma$; or if a polarization weight of an $i^{th}$ polarized channel in the first sequence is $W_i = \sum_{j=0}^{n-1} B_j * (2^{j*\alpha_j}+b_j)^{\gamma_j}$, and the first difference is $\Delta W_n = (2^{n*\alpha_n}+b_n)^{\gamma_n}$; or if a polarization weight of an $i^{th}$ polarized channel in the first sequence is $W_i = \sum_{j=0}^{n-1} B_j * (\beta^j + a*\theta^j)$, and the first difference is $\Delta W_n = (\beta)^n + a*(\theta)^n$; or if a polarization weight of an $i^{th}$ polarized channel in the first sequence is $W_i = \sum_{j=0}^{n-1} B_j * ((\beta_j) + a_j * (\theta_j)^j)$, and the first difference is $\Delta W_n = (\beta_n)^n + a_n * (\theta_n)^n$, where i is an index of the polarized channel, i is an integer greater than or equal to 0 and less than N, $i \triangleq B_{n-1} B_{n-2} \ldots B_0$, $B_j \in \{0,1\}$, $j \in \{0,1,\ldots,n-1\}$, $n = \log_2(N)$, $\beta$ and $\theta$ are fixed values whose value ranges are [0, 2], $\alpha$ and $\gamma$ are fixed values whose value ranges satisfy $\alpha \times \gamma \in [0,2]$, b is a fixed value whose value range is [-1, 1], and a is a fixed value whose value ranges are [-1, 1].

Second Case: Non-Symmetrical Extension

In this extension manner, the reliability values of the second sequence are obtained by adding a second difference to the reliability values of the first sequence; however, in this case, the second difference added to each polarized channel is not a fixed value, so that internal sorting of the second sequence is not completely consistent with internal sorting of the first sequence. Therefore, this extension manner may be referred to as non-symmetrical extension.

In the second case, the basic sequence includes a first sequence whose length is N and a second sequence whose length is N, the first sequence and the second sequence are different sequences, the sequence is a sequence whose length is 2N and that is obtained by sorting reliability values of the first sequence and reliability values of the second sequence in ascending order, sequence numbers of N polarized channels in the first sequence are arranged in a first order, sequence numbers of N polarized channels in the second sequence are arranged in a second order, and the first order is different from the second order. The reliability values of the N polarized channels arranged in the first order in the first sequence respectively correspond to polarization weight values of the N polarized channels that are arranged in ascending order, and indexes of the polarized channels corresponding to the first sequence are 0, . . . , and N-1. The reliability values of the N polarized channels arranged in the second order in the second sequence are obtained by adding a second difference to a polarization weight value of each polarized channel in the second sequence, and index numbers of the polarized channels corresponding to the second sequence are N, . . . , and 2N-1.

For example, a sequence whose length is 16 is generated from two basic sequences whose length is 8. For example, an order in the upper half segment (corresponding to the first sequence) is: Seq8_0=[0 1 2 3 4 5 6 7], and an order in the lower half segment (corresponding to the second sequence) is: Seq8_1=[0 1 2 4 3 5 6 7]+8.

PW values of the basic sequence whose length is 8 are given to the upper half segment, and the PW values of the second sequence plus the second difference $\Delta W4 = 2^{(3/4)} = 1.681793$ are successively given to the lower half segment, to obtain PW values corresponding to the sequence whose length is 16, as shown in Table 6.

TABLE 6

| | Polarized channel sequence number | | | | | | | |
|---|---|---|---|---|---|---|---|---|
| | 0 | 1 | 2 | 3 | 4 | 5 | 6 | 7 |
| PW8 | 0 | 1 | 1.189207 | 1.414214 | 2.189207 | 2.414214 | 2.603421 | 3.603421 |
| | Polarized channel sequence number | | | | | | | |
| | 8 | 9 | 10 | 12 | 11 | 13 | 14 | 15 |
| PW8 + $\Delta W_4$ | 1.681793 | 2.681793 | 2.871 | 3.096006 | 3.871 | 4.096006 | 4.285214 | 5.285214 |

A sequence obtained after the PW values of 16 polarized channels are sorted is:

Seq16=[0123845691012711131415]

In the second case, a method for obtaining the polarization weight of each polarized channel corresponding to the first sequence may be obtained through calculation by using any one of the basic forms and variation forms in the first-type to the third-type PW formulas. To be specific:

the polarization weight of each channel corresponding to the first sequence is: $W_i=\Sigma_{j=0}^{n-1}B_j^*(\beta)^j$; or the polarization weight of each channel corresponding to the first sequence is: $W_i=\Sigma_{j=0}^{n-1}B_j^*(\beta)^j$; or the polarization weight of each channel corresponding to the first sequence is: $W_i=\Sigma_{j=0}^{n-1}B_j^*(\beta_{B_n,B_{n-1},B_{n-2},\ldots,B_{j+1}})^j$; or the polarization weight of each channel corresponding to the first sequence is: $W_i=\Sigma_{j=0}^{n-1}B_j^*(\beta_{B_n,B_{n-1},B_{n-2},\ldots,B_0})^j$; or the polarization weight of each channel corresponding to the first sequence is: $W_i=\Sigma_{j=0}^{n-1}B_j^*(2^{j*\alpha}+b)^\gamma$; or the polarization weight of each channel corresponding to the first sequence is: $W_i=\Sigma_{j=0}^{n-1}B_j^*(2^{j*\alpha_j}+b_j)^{\gamma_j}$; or the polarization weight of each channel corresponding to the first sequence is:

$$W_i = \sum_{j=0}^{n-1} B_j * \left(2^{j*\alpha_{B_n,B_{n-1},B_{n-2},\ldots,B_{j+1}}} + b_{B_n,B_{n-1},B_{n-2},\ldots,B_{j+1}}\right)^{\gamma_{B_n,B_{n-1},B_{n-2},\ldots,B_{j+1}}};$$

or the polarization weight of each channel corresponding to the first sequence is:

$$W_i = \sum_{j=0}^{n-1} B_j * \left(2^{j*\alpha_{B_n,B_{n-1},B_{n-2},\ldots,B_0}} + b_{B_n,B_{n-1},B_{n-2},\ldots,B_0}\right)^{\gamma_{B_n,B_{n-1},B_{n-2},\ldots,B_0}};$$

or the polarization weight of each channel corresponding to the first sequence is: $W_i=\Sigma_{j=0}^{n-1}B_j^*(\beta^j+\alpha^*\theta^j)$; or the polarization weight of each channel corresponding to the first sequence is: $W_i=\Sigma_{j=0}^{n-1}B_j^*((\beta_j)^j+a_j^*(\theta_j)^j)$; or the polarization weight of each channel corresponding to the first sequence is:

$$W_i = \sum_{j=0}^{n-1} B_j * \left(2^{j*\alpha_{B_n,B_{n-1},B_{n-2},\ldots,B_{j+1}}} + b_{B_n,B_{n-1},B_{n-2},\ldots,B_{j+1}}\right)^{\gamma_{B_n,B_{n-1},B_{n-2},\ldots,B_{j+1}}},$$

or the polarization weight of each channel corresponding to the first sequence is:

$$W_i = \sum_{j=0}^{n-1} b_j * ((\beta_{B_n,B_{n-1},B_{n-2},\ldots,B_0})^j + a_{B_n,B_{n-1},B_{n-2},\ldots,B_0} * (\theta_{B_n,B_{n-1},B_{n-2},\ldots,B_0})^j),$$

where i is an index of the polarized channel, i is an integer greater than or equal to 0 and less than N, $i \triangleq B_n B_{n-1} B_{n-2} \ldots B_0$, $B_j \in \{0,1\}$, $j \in \{0,1,\ldots,n\}$, $n=\log_2(N)$, $\beta$ and $\theta$ are fixed values whose value ranges are [0, 2], $\alpha$ and $\gamma$ are fixed values whose value ranges satisfy $\alpha \times \gamma \in [0,2]$, b is a fixed value whose value range is [−1, 1], and a is a fixed value whose value range is [−1, 1].

The polarization weight of each polarized channel corresponding to the second sequence may also be obtained through calculation by using any one of the basic forms and variation forms in the first-type to the third-type PW formulas. Based on each of the first-type to the third-type PW formulas, the polarization weight of each polarized channel corresponding to the second sequence and the corresponding second difference may be obtained as follows:

a polarization weight of an $i^{th}$ polarized channel in the second sequence is $W_i=\Sigma_{j=0}^{n-1}B_j^*(\beta)^j$, and the second difference is $\Delta W_n=\beta^n$; or a polarization weight of an $i^{th}$ polarized channel in the second sequence is $W_i=\Sigma_{j=0}^{n-1}B_j^*(\beta_j)^j$, and the second difference is $\Delta W_n=(\beta_n)^n$; or a polarization weight of an $i^{th}$ polarized channel in the second sequence is $W_i=\Sigma_{j=0}^{n-1}B_j^*(\beta_{B_n,B_{n-1},B_{n-2},\ldots,B_{j+1}})^j$, and the second difference is $\Delta W_n(s)=(\beta_s)^n$, where $s=B_n$, indicating a segment sequence number; and $B_j$ is 0 or 1 that indicates a channel index in binary; or a polarization weight of an $i^{th}$ polarized channel in the second sequence is $W_i=\Sigma_{j=0}^{n-1}B_j^*(\beta_{B_n,B_{n-1},B_{n-2},\ldots,B_0})^j$, and the second difference is $\Delta W_n(i)=(\beta_i)^n$; or a polarization weight of an $i^{th}$ polarized channel in the second sequence is $W_i=\Sigma_{j=0}^{n-1}B_j^*(2^{j*\alpha}+b)^\gamma$, and the second difference is $\Delta W_n=(2^{n*\alpha}+b)^\gamma$; or a polarization weight of an $i^{th}$ polarized channel in the second sequence is $W_i=\Sigma_{j=0}^{n-1}B_j^*(2^{j*\alpha_j}+b_j)^{\gamma_j}$, and the second difference is $\Delta W_n=(2^{n*\alpha_n}+b_n)^{\gamma_n}$; or a polarization weight of an $i^{th}$ polarized channel in the second sequence is:

$$\sum_{j=0}^{n-1} B_j * \left(2^{j*\alpha_{B_n,B_{n-1},B_{n-2},\ldots,B_{j+1}}} + b_{B_n,B_{n-1},B_{n-2},\ldots,B_{j+1}}\right)^{\gamma_{B_n,B_{n-1},B_{n-2},\ldots,B_{j+1}}},$$

and the second difference is $\Delta W_n(s)=(2^{n*\alpha_s}+b_s)^{\gamma_s}$; or a polarization weight of an $i^{th}$ polarized channel in the second sequence is:

$$\sum_{j=0}^{n-1} B_j * \left(2^{j*\alpha_{B_n,B_{n-1},B_{n-2},\ldots,B_0}} + b_{B_n,B_{n-1},B_{n-2},\ldots,B_0}\right)^{\gamma_{B_n,B_{n-1},B_{n-2},\ldots,B_0}},$$

and the second difference is $\Delta W_n(i)=(2^{n*\alpha_i}+b_i)^{\gamma_i}$; or a polarization weight of an $i^{th}$ polarized channel in the second sequence is $W_i=\Sigma_{j=0}^{n-1}B_j^*(\beta^j+a^*\theta^j)$, and the second difference is $\Delta W_n=(\beta)^n+a^*(\theta)^n$; or a polarization weight of an $i^{th}$ polarized channel in the second sequence is $W_i=\Sigma_{j=0}^{n-1}B_j*((\beta_j)^\gamma+a_j*(\theta^\gamma)^i$, and the second difference is $\Delta W_n=(\beta_n)^n+a_n*(\theta_n)^n$; or a polarization weight of an $i^{th}$ polarized channel in the second sequence is: $W_i=\Sigma_{j=0}^{n-1}B_j*(\beta_{B_n, B_{n-1}, B_{n-2}, \ldots, B_{j+1}})^\gamma+a_{B_n, B_{n-1}, B_{n-2}, \ldots, B_{j+1}}*(\theta_{B_n, B_{n-1}, B_{n-2}, \ldots, B_{j+1}})^\gamma)$, and the second difference is $\Delta W_n=(\beta_s)^n+a_s*(\theta_s)^n$; or a polarization weight of an $i^{th}$ polarized channel in the second sequence is $W_i=\Sigma_{j=0}^{n-1}B_j*((\beta_{B_n,B_{n-1},B_{n-2},\ldots,B_0})^\gamma+a_{B_n,B_{n-1},B_{n-2},\ldots,B_0}*(\theta_{B_n,B_{n-1},B_{n-2},\ldots,B_0})^\gamma)$, and the second difference is $\Delta W_n=(\beta_i)^n+a_i*(\theta_i)^n$, where i is an index of the polarized channel, i is an integer greater than or equal to N and less than 2N−1, $i \triangleq B_n B_{n-1} B_{n-2} \ldots B_0$, $B_j \in \{0,1\}$, $j \in \{0,1,\ldots,n\}$, $n=\log_2(N)$, β and θ are fixed values whose value ranges are [0, 2], α and γ are fixed values whose value ranges satisfy $\alpha \times \gamma \in [0,2]$, b is a fixed value whose value range is [−1, 1], and a is a fixed value whose value range is [−1, 1].

The polarization weight of each polarized channel corresponding to the second sequence plus the second difference is equivalent to $n=\log_2(2N)$ in the foregoing first-type to the third-type formulas in various basic forms and variation forms, because a code length obtained after the extension is 2N.

In another implementation, each of the first sequence and the second sequence may be a PW sequence. To be specific, each of the first sequence and the second sequence that are used as the basic sequence is a sequence in which the polarization weights are sorted. However, the polarization weight calculation manner of the first sequence is different from the polarization weight calculation manner of the second sequence.

The basic sequence includes a first sequence whose length is N and a second sequence whose length is N, the sequence is a sequence whose length is 2N and that is obtained by sorting polarization weight values of the first sequence and polarization weight values of the second sequence in ascending order, indexes of the polarized channels corresponding to the first sequence are 0, . . . , and N−1, and index numbers of the polarized channels corresponding to the second sequence are N, . . . , and 2N−1; and a polarization weight calculation manner of the first sequence is different from a polarization weight calculation manner of the second sequence.

Any one of the following is used for the polarization weight calculation manner of the first sequence and the polarization weight calculation manner of the second sequence:

a polarization weight calculation manner: $W_i=\Sigma_{j=0}^{n-1}B_j*(\beta)^j$; or a polarization weight calculation manner: $W_i=\Sigma_{j=0}^{n-1}B_j*(\beta_j)^\gamma$; or a polarization weight calculation manner: $W_i=\Sigma_{j=0}^{n-1}B_j*(\beta_{B_n, B_{n-1}, B_{n-2}, \ldots, B_{j+1}})^\gamma$; or a polarization weight calculation manner: $W_i=\Sigma_{j=0}^{n-1}B_j*(\beta_{B_n, B_{n-1}, B_{n-2}, \ldots, B_0})^\gamma$, where i is an index of an ith polarized channel, $i \triangleq B_{n-1} B_{n-2} \ldots B_0$, $B_j \in \{0,1\}$, $j \in \{0,1,\ldots,n-1\}$, $n=\log_2(2N)$, and β is a fixed value. For a same formula form, if values of β are different, it is also considered that polarization weight calculation formulas are different.

The polar code encoding method provided in the embodiments of this application is described above in detail with reference to FIG. 1 to FIG. 5. A polar code encoding apparatus and a polar code decoding apparatus that are provided in the embodiments of this application are described below with reference to FIG. 6 to FIG. 15.

Figure 6:
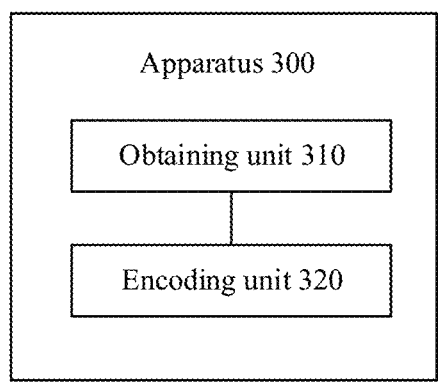
FIG. 6 is a schematic block diagram of a polar code encoding apparatus 300 according to an embodiment of this application.

FIG. 6 is a schematic block diagram of a polar code encoding apparatus 300 according to an embodiment of this application. As shown in FIG. 6, the apparatus 300 mainly includes an obtaining unit 310 and an encoding unit 320.

The obtaining unit 310 is configured to obtain a sequence corresponding to a required mother code length and a to-be-encoded bit. The sequence is generated based on a basic sequence, and a length of the basic sequence is less than the mother code length.

The obtaining unit 310 may be configured to perform step 110 in the foregoing method embodiment. For detailed content, refer to the descriptions related to step 110, and details are not described herein again.

The encoding unit 320 is configured to perform polar code encoding on the to-be-encoded bit by using the sequence corresponding to the required mother code length, to obtain an encoded bit.

The encoding unit 320 may be configured to perform step 130 in the foregoing method embodiment. For detailed content, refer to the descriptions related to step 110, and details are not described herein again.

The apparatus 300 may be a network device communicating with a terminal, or may be a terminal.

Figure 7:
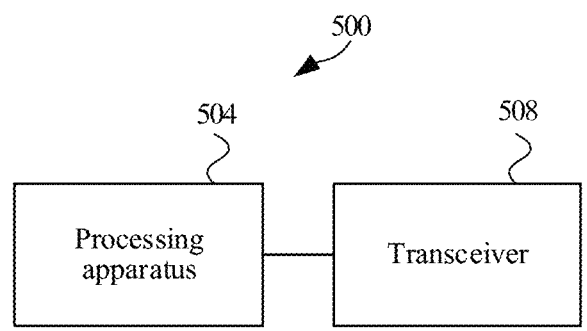
FIG. 7 is a schematic structural diagram of a communications device 500 according to an embodiment of this application.

FIG. 7 shows a communications device 500 for implementing an encoding function according to an embodiment of this application. The communications device includes a processing apparatus 504 and a transceiver 508. The processing apparatus 504 is configured to: obtain a sequence corresponding to a required mother code length and a to-be-encoded bit, and perform polar code encoding on the to-be-encoded bit by using the sequence corresponding to the required mother code length, to obtain an encoded bit, where the sequence is generated based on a basic sequence, and a length of the basic sequence is less than the mother code length.

The processing apparatus 504 may be configured to perform some or all of steps 110 to 130 in the foregoing method embodiment. For detailed content, refer to the descriptions related to steps 110 to 130 and details are not described herein again.

The transceiver 508 is configured to send the encoded bit.

Optionally, the processing apparatus 504 may be a chip or an integrated circuit.

The communications device 500 may be a network device (such as a base station) communicating with a terminal, or may be a terminal.

An embodiment of this application further provides a processing apparatus 504 for encoding, configured to implement the polar code encoding method in the foregoing embodiment. A part or all of the encoding method in the foregoing embodiment may be implemented by using hardware, or may be implemented by using software.

Figure 8:
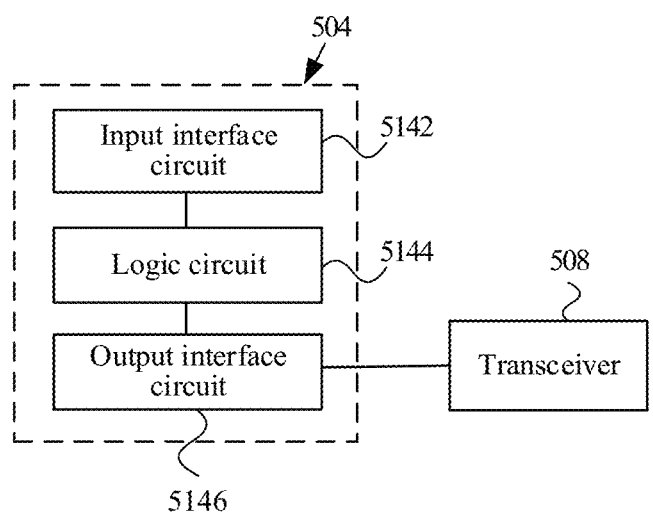
FIG. 8 is a schematic internal structural diagram of a processing apparatus 504.

Optionally, when all or a part of the polar code encoding method in the foregoing embodiment is implemented by using hardware, refer to FIG. 8. FIG. 8 is a schematic internal structural diagram of the processing apparatus 504. The processing apparatus 504 includes: an input interface circuit 5142, configured to obtain a sequence corresponding to a required mother code length and a to-be-encoded bit, where the sequence is generated based on a basic sequence, and a length of the basic sequence is less than the mother code length; a logic circuit 5144, configured to perform polar code encoding on the to-be-encoded bit by using the sequence corresponding to the required mother code length, to obtain an encoded bit; and an output interface circuit 5146, configured to output the encoded bit.

The logic circuit 5144 may be configured to perform the encoding method performed by the sending device in FIG. 4. For details, refer to the descriptions in the foregoing method embodiment, and details are not described herein again. During specific implementation, the processing apparatus may be a chip or an integrated circuit.

Figure 9:
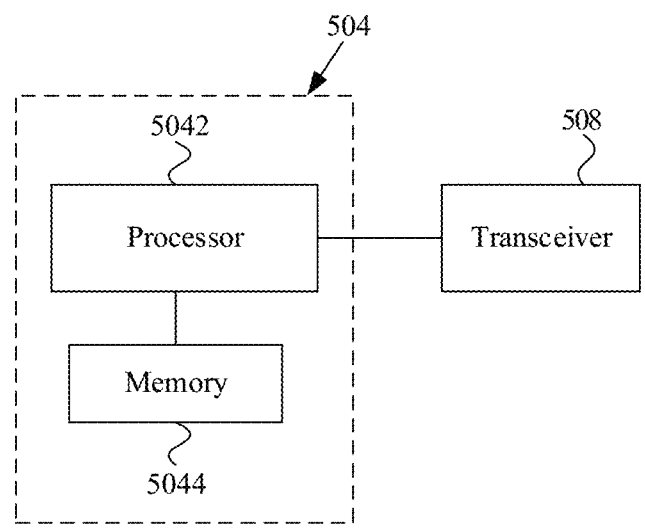
FIG. 9 is another schematic internal structural diagram of the processing apparatus 504.

Optionally, when all or a part of the polar code encoding method in the foregoing embodiment is implemented by using software, the processing apparatus 504 includes a processor 5042 and a memory 5044. For details, refer to FIG. 9. FIG. 9 is a schematic internal structural diagram of the processing apparatus 504.

The memory 5044 is configured to store a program.

The processor 5042 is configured to execute the program stored in the memory, and when the program is executed, the processor 5042 is configured to perform the polar code encoding method in the foregoing embodiment.

Figure 10:
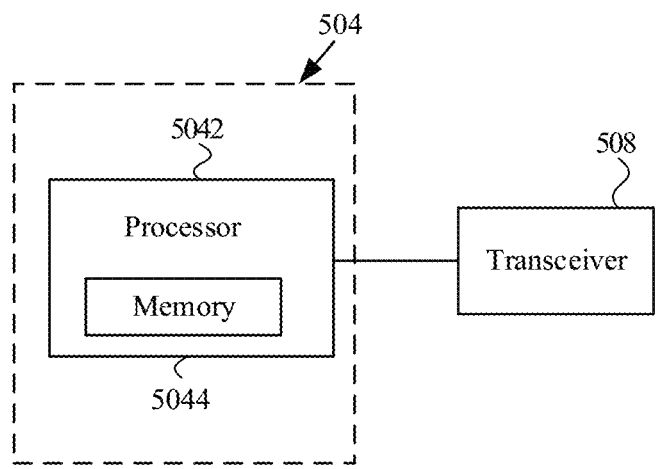
FIG. 10 is another schematic internal structural diagram of the processing apparatus 504.

The memory may be a physically independent unit, or may be integrated with the processor. For details, refer to FIG. 10. FIG. 10 is another schematic internal structural diagram of the processing apparatus.

In another optional embodiment, the processing apparatus 504 may include only the processor 5042. The memory 5042 is located outside the processing apparatus 504. The processor 5042 is connected to the memory 5044 by using a circuit/wire, and is configured to read and execute the program stored in the memory 5044.

Figure 11:
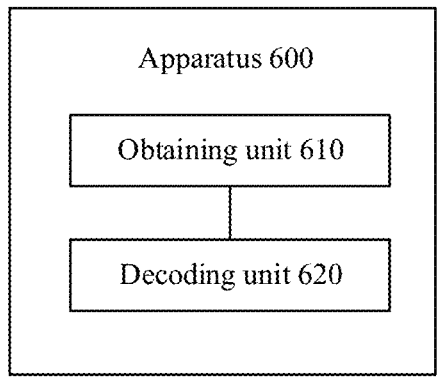
FIG. 11 is a schematic block diagram of a polar code decoding apparatus 600 according to an embodiment of this application.

FIG. 11 is a schematic block diagram of a polar code decoding apparatus 600 according to an embodiment of this application. As shown in FIG. 11, the apparatus 600 mainly includes an obtaining unit 610 and a decoding unit 620.

The obtaining unit 610 is configured to obtain a to-be-decoded bit and a sequence corresponding to a required mother code length. The sequence corresponding to the required mother code length is generated based on a basic sequence, and a length of the basic sequence is less than the mother code length.

The decoding unit 620 is configured to decode the to-be-decoded bit by using the sequence corresponding to the required mother code length, to obtain a decoded bit.

Figure 12:
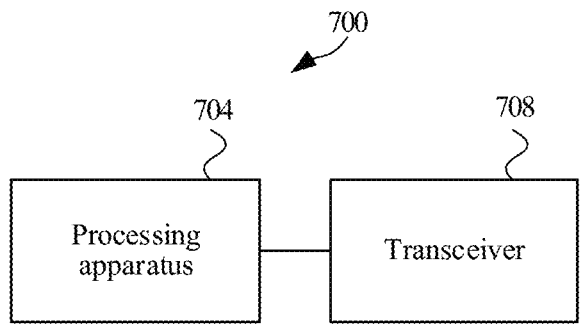
FIG. 12 is a schematic structural diagram of a communications device 700 according to an embodiment of this application.

FIG. 12 shows a communications device 700 for implementing a decoding function according to an embodiment of this application. The communications device includes a processing apparatus 704 and a transceiver 708.

The transceiver 708 is configured to receive a to-be-decoded bit.

The processing apparatus 704 is configured to: obtain a sequence corresponding to a required mother code length, and decode the to-be-decoded bit by using the sequence corresponding to the required mother code length, to obtain a decoded bit. The sequence corresponding to the required mother code length is generated based on a basic sequence, and a length of the basic sequence is less than the mother code length.

An embodiment of this application further provides a processing apparatus 704 for decoding, configured to implement the decoding method in the foregoing embodiment. A part or all of the decoding method in the foregoing embodiment may be implemented by using hardware, or may be implemented by using software. A structure of the processing apparatus 704 is the same as a structure of the processing apparatus in the foregoing encoding apparatus, and only implemented functions are different. Therefore, only the difference is described herein.

Figure 13:
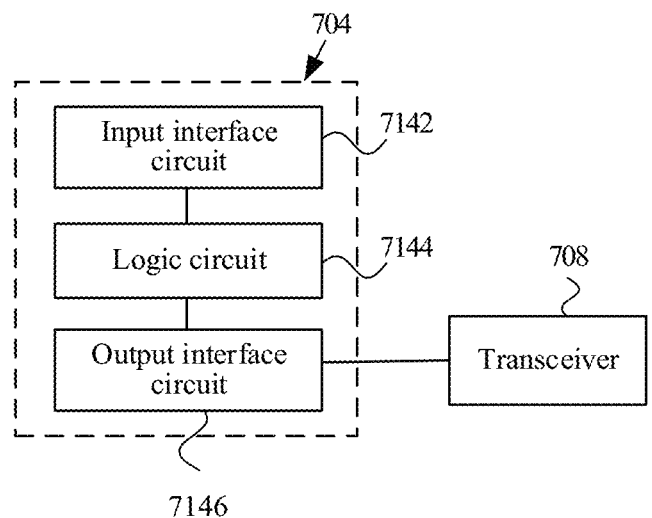
FIG. 13 is a schematic internal structural diagram of a processing apparatus 704.

FIG. 13 is a schematic internal structural diagram of the processing apparatus 704.

When the processing apparatus 704 is implemented by using hardware, a logic circuit 7144 in the processing apparatus 704 is configured to decode an input to-be-decoded bit by using a sequence corresponding to a required mother code length, to obtain a decoded bit.

The logic circuit 7144 may be configured to perform the decoding method performed by the receiving device in FIG. 4. For details, refer to the descriptions on a decoding side in the foregoing method embodiment, and details are not described herein again. During specific implementation, the processing apparatus 704 may be a chip or an integrated circuit.

Figure 14:
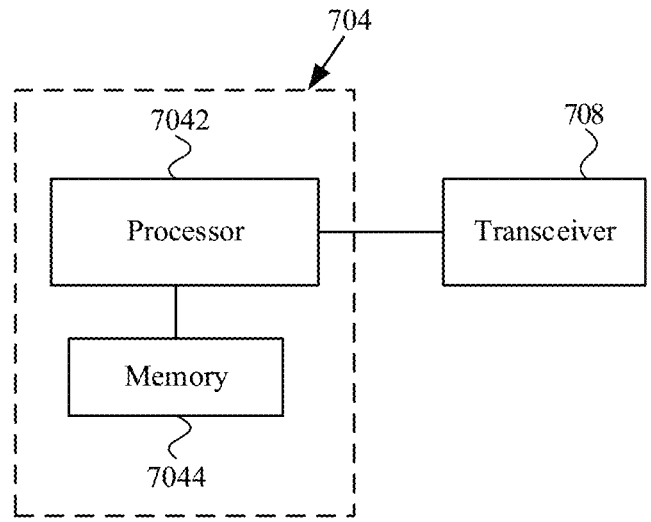
FIG. 14 is another internal structural diagram of the processing apparatus 704.

When a part or all of the decoding method in the foregoing embodiment is implemented by using software, refer to FIG. 14. FIG. 14 is another internal structural diagram of the processing apparatus. A processor 7042 in the processing apparatus is configured to execute a program stored in a memory 7044, and when the program is executed, the processing apparatus 7042 performs the decoding method in the foregoing embodiment. The memory 7044 may be a physically independent unit, or may be integrated with the processor 7042.

In another optional embodiment, the processing apparatus may alternatively include only the processor. The memory is located outside the processing apparatus. The processor is connected to the memory by using a circuit/wire, and is configured to read and execute the program stored in the memory.

In the embodiments of this application, the processing apparatus for encoding and the processing apparatus for decoding may be independent of each other in an actual application. Alternatively, the processing apparatus for encoding and the processing apparatus for decoding may be integrated together, to be specific, a set of apparatuses is formed.

Figure 15:
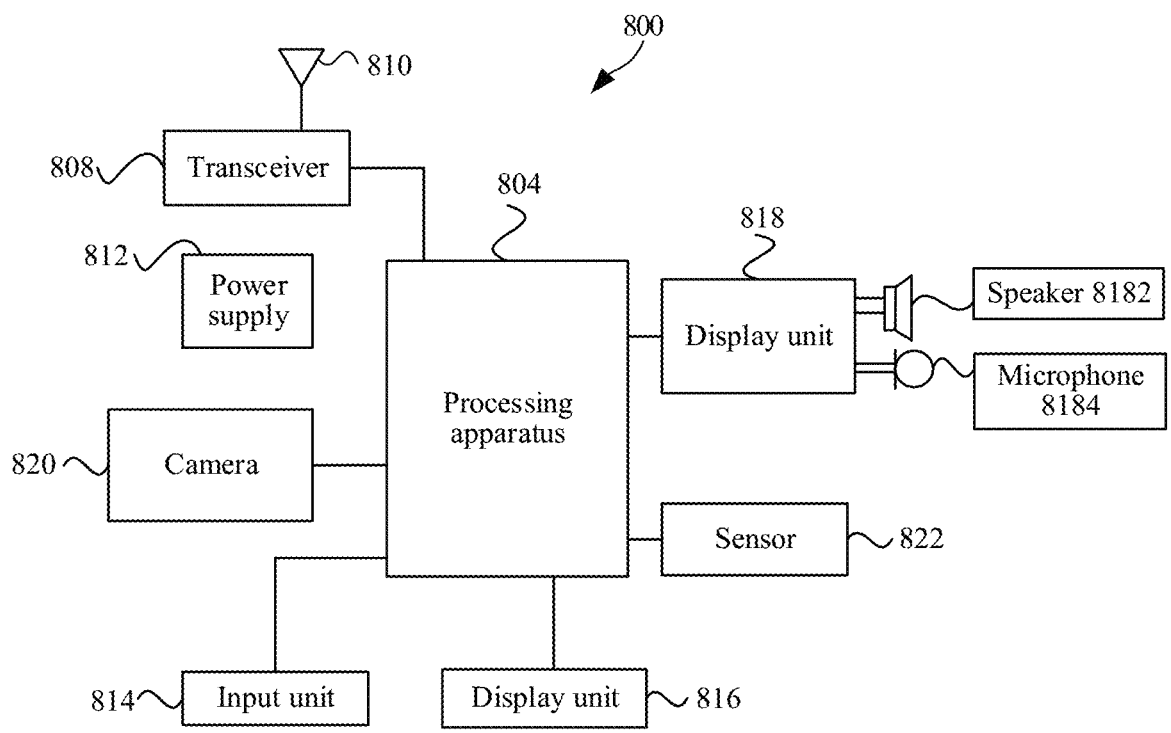
FIG. 15 is a schematic structural diagram of a terminal device 800.

The communications device may be a terminal, or may be a network device. When the communications device is a terminal, refer to FIG. 15. FIG. 15 is a schematic structural diagram of a terminal device 800. The terminal 800 includes a processing apparatus 804. The processing apparatus 804 may be configured to perform the encoding method and/or the decoding method according to the embodiments of this application. The terminal 800 may further include a power supply 812, configured to supply power to components or circuits in the terminal. The terminal may further include an antenna 810, configured to send, by using a radio signal, uplink data output by a transceiver, or output a received radio signal to the transceiver.

In addition, to make functions of the terminal more perfect, the terminal may further include one or more of an input unit 814, a display unit 816, an audio circuit 818, a camera 820, a sensor 822, and the like. The audio circuit may include a speaker 8182, a microphone 8184, and the like.

The polar code encoding apparatus and the polar code decoding apparatus that are provided in the embodiments of this application are described above with reference to FIG. 6 to FIG. 15. For how to obtain, based on a basic sequence, a sequence corresponding to a required mother code length, refer to FIG. 1 to FIG. 5 and related descriptions thereof.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on the computer, the procedure or functions according to the embodiments of the present invention are all or partially generated. The computer may be a general-purpose computer, a special-purpose computer, a computer network, or other programmable apparatuses. The computer instructions may be stored in a computer-readable storage medium, or may be transmitted by using the computer-readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape, a USB flash drive, a ROM, or a RAM), an optical medium (for example, a CD or a DVD), a semiconductor medium (for example, a solid state disk (SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method, comprising:
    obtaining, by a device, a first sequence corresponding to a required mother code length, wherein the first sequence is generated based on a basic sequence, and a length of the basic sequence is less than the mother code length;
    obtaining, by the device, a to-be-encoded bit; and
    performing, by the device, polar code encoding on the to-be-encoded bit using the first sequence, to obtain an encoded bit, wherein:
        the basic sequence comprises a second sequence whose length is N, the first sequence has a length of 2N and is obtained by sorting reliability values of the second sequence and reliability values of a third sequence in ascending order, sequence numbers of N polarized channels in the second sequence are arranged in a predetermined order, and the predetermined order is different from an order of polarization weights of the N polarized channels;
        reliability values of the N polarized channels in the second sequence arranged in the predetermined order respectively correspond to polarization weight values of the N polarized channels that are arranged in ascending order, and indexes of polarized channels of the N polarized channels corresponding to the second sequence are 0, . . . , and 2N−1; and
        reliability values of N polarized channels arranged in the predetermined order in the third sequence are obtained by adding a first difference to a respective polarization weight value of each polarized channel in the second sequence, and indexes of polarized channels of the N polarized channels corresponding to the third sequence are N, . . . , and 2N−1.

2. The method according to claim 1, wherein:
    a polarization weight of an $i^{th}$ polarized channel in the second sequence is $W_i = \sum_{j=0}^{n-1} B_j^*(\beta)^j$, and the first difference is $\Delta W_n = \beta^n$; or
    a polarization weight of an $i^{th}$ polarized channel in the second sequence is $W_i = \sum_{j=0}^{n-1} B_j^*(\beta_j)^j$, and the first difference is $\Delta W_n = (\beta_n)^n$; or
    a polarization weight of an $i^{th}$ polarized channel in the second sequence is $W_i = \sum_{j=0}^{n-1} B_j^*(2^{j\alpha} + b)^\gamma$, and the first difference is $\Delta W_n = (2^{n*\alpha} + b)^\gamma$; or
    a polarization weight of an $i^{th}$ polarized channel in the second sequence is $W_i = \sum_{j=0}^{n-1} B_j^*(2^{j*\alpha_j} + b_j)^{\gamma_j}$, and the first difference is $\Delta W_n = (2^{n*\alpha_n} + b_n)^{\gamma_n}$; or
    a polarization weight of an $i^{th}$ polarized channel in the second sequence is $W_i = \sum_{j=0}^{n-1} B_j^*(\beta^j + \alpha^*\theta^j)$, and the first difference is $\Delta W_n = (\beta)^n + \alpha^*(\theta)^n$; or
    a polarization weight of an $i^{th}$ polarized channel in the second sequence is $W_i = \sum_{j=0}^{n-1} B_j^*((\beta_j)^j + \alpha_j^*(\theta_j)^j)$, and the first difference is $\Delta W_n = (\beta_n)^n + \alpha_n^*(\theta_n)^n$, wherein
    i is an index of a polarized channel, i is an integer greater than or equal to o and less than N, $i \triangleq B_{n-1}B_{n-2} \ldots B_0$, $B_j \in \{0,1\}$, $j \in \{0,1 \ldots, n-1\}$, $n = \log2(N)$, $\beta$ and $\theta$ are fixed values whose value ranges are $[0,2]$, $\alpha$ and $\gamma$ are fixed values whose value ranges satisfy $\alpha \times \gamma \in [0,2]$, b is a fixed value whose value range is $[-1,1]$, and a is a fixed value whose value range is $[-1,1]$.

3. An apparatus, comprising:
    a processor; and
    a non-transitory computer-readable storage medium storing a program to be executed by the processor, the program including instructions for:
        obtaining a first sequence corresponding to a required mother code length and a to-be-encoded bit, wherein the first sequence is generated based on a basic sequence, and a length of the basic sequence is less than the mother code length; and
        performing polar code encoding on the to-be-encoded bit using the first sequence corresponding to the required mother code length, to obtain an encoded bit, wherein:
            the basic sequence comprises a second sequence whose length is N, the first sequence has a length 2N and is obtained by sorting reliability values of the second sequence and reliability values of a third sequence in ascending order, sequence numbers of N polarized channels in the second sequence are arranged in a predetermined order, and the predetermined order is different from an order of polarization weights of the N polarized channels;
            reliability values of the N polarized channels in the second sequence arranged in the predetermined order respectively correspond to polarization weight values of the N polarized channels that are arranged in ascending order, and indexes of polarized channels of the N polarized channels corresponding to the first sequence are 0, . . . , and N−1i; and
            reliability values of N polarized channels arranged in the predetermined order in the third sequence are obtained by adding a first difference to a respective polarization weight value of each polarized channel in the second sequence, and indexes of polarized channels of the N polarized channels corresponding to the second sequence are N, . . . , and 2N−1.

4. The apparatus according to claim 3, wherein:
a polarization weight of an $i^{th}$ polarized channel in the second sequence is $W_i=\Sigma_{j=0}^{n-1}B_j*(\beta)^j$, and the first difference is $\Delta W_n=\beta^n$; or
a polarization weight of an $i^{th}$ polarized channel in the second sequence is $W_i=\Sigma_{j=0}^{n-1}B_j*(\beta_j)^j$, and the first difference is $\Delta W_n=(\beta_n)^n$; or
a polarization weight of an $i^{th}$ polarized channel in the second sequence is $W_i=\Sigma_{j=0}^{n-1}B_j*(2^{j*\alpha}+b)^\gamma$, and the first difference is $\Delta W_n=(2^{n*\alpha}+b)^\gamma$; or
a polarization weight of an $i^{th}$ polarized channel in the second sequence is $W_i=\Sigma_{j=0}^{n-1}B_j*(2^{j*\alpha_j}+b_j)^{\gamma j}$, and the first difference is $\Delta W_n=(2^{n*\alpha_n}+b_n)^{\gamma n}$; or
a polarization weight of an $i^{th}$ polarized channel in the second sequence is $W_i=\Sigma_{j=0}^{n-1}B_j*(\beta^j+\alpha*\theta^j)$, and the first difference is $\Delta W_n=(\beta)^n+\alpha*(\theta)^n$; or
a polarization weight of an $i^{th}$ polarized channel in the second sequence is $W_i=\Sigma_{j=0}^{n-1}B_j*((\beta_j)^j+\alpha_j*(\theta_j)^j)$, and the first difference is $\Delta W_n=(\beta_n)^n+\alpha_n*(\theta_n)^n$, wherein
i is an index of a polarized channel, i is an integer greater than or equal to o and less than N, $i \triangleq B_{n-1}B_{n-2}\ldots B_0$, $B_j \in \{0,1\}$, $j \in \{0,1,\ldots,n-1\}$, $n=\log_2(N)$, $\alpha$ and $\theta$ are fixed values whose value ranges are [0,2], $\alpha$ and $\gamma$ are fixed values whose value ranges satisfy $\alpha \times \gamma \in [0,2]$, b is a fixed value whose value range is [−1,1], and a is a fixed value whose value range is [−1,1].

5. A method, comprising:
obtaining, by a device, a first sequence corresponding to a required mother code length, wherein the first sequence is generated based on a basic sequence, and a length of the basic sequence is less than the mother code length;
obtaining, by the device, a to-be-decoded bit; and
decoding, by the device, the to-be-decoded bit using the first sequence corresponding to the required mother code length, to obtain a decoded bit, wherein:
the basic sequence comprises a second sequence whose length is N, the first sequence has a length 2N and is obtained by sorting reliability values of the second sequence and reliability values of a third sequence in ascending order, sequence numbers of N polarized channels in the second sequence are arranged in a predetermined order, and the predetermined order is different from an order of polarization weights of the N polarized channels;
reliability values of the N polarized channels in the second sequence arranged in the predetermined order respectively correspond to polarization weight values of the N polarized channels that are arranged in ascending order, and indexes of polarized channels of the N polarized channels corresponding to the first sequence are 0, . . . , and N−1; and
reliability values of N polarized channels arranged in the predetermined order in the third sequence are obtained by adding a first difference to a respective polarization weight value of each polarized channel in the second sequence, and indexes of polarized channels of the N polarized channels corresponding to the third sequence are N, . . . , and 2N−1.

6. The method according to claim 5, wherein a polarization weight of an $i^{th}$ polarized channel in the second sequence is $W_i=\Sigma_{j=0}^{n-1}B_j*(\beta)^j$, and the first difference is $\Delta W_n=\beta^n$;
wherein i is an index of a polarized channel, i is an integer greater than or equal to o and less than N, $i \triangleq B_{n-1}B_{n-2}\ldots B_0$, $B_j \in \{0,1\}$, $j \in \{0,1,\ldots,n-1\}$, $n=\log_2(N)$, $\beta$ and $\theta$ are fixed values whose value ranges are [0,2], $\alpha$ and $\gamma$ are fixed values whose value ranges satisfy $\alpha \times \gamma \in [0,2]$, b is a fixed value whose value range is [−1,1], and a is a fixed value whose value range is [−1,1].

7. The method according to claim 5, wherein a polarization weight of an $i^{th}$ polarized channel in the first sequence is $W_i=\Sigma_{j=0}^{n-1}B_j*(\beta_j)*(\beta^j)^j$, and the first difference is $\Delta W_n=(\beta_n)^n$;
wherein i is an index of a polarized channel, i is an integer greater than or equal to o and less than N, $i \triangleq B_{n-1}B_{n-2}\ldots B_0$, $B_j \in \{0,1\}$, $j \in \{0,1,\ldots,n-1\}$, $n=\log_2(N)$, $\beta$ and $\theta$ are fixed values whose value ranges are [0,2], $\alpha$ and $\gamma$ are fixed values whose value ranges satisfy $\alpha \times \gamma \in [0,2]$, b is a fixed value whose value range is [−1,1], and a is a fixed value whose value range is [−1,1].

8. The method according to claim 5, wherein a polarization weight of an $i^{th}$ polarized channel in the first sequence is $W_i=\Sigma_{j=0}^{n-1}B_j*(2^{j*\alpha}+b)^\gamma$, and the first difference is $\Delta W_n=(2^{n*\alpha}+b)^\gamma$;
wherein i is an index of a polarized channel, i is an integer greater than or equal to o and less than N, $i \triangleq B_{n-1}B_{n-2}\ldots B_0$, $B_j \in \{0,1\}$, $j \in \{0,1,\ldots,n-1\}$, $n=\log_2(N)$, $\beta$ and $\theta$ are fixed values whose value ranges are [0,2], $\alpha$ and $\gamma$ are fixed values whose value ranges satisfy $\alpha \times \gamma \in [0,2]$, b is a fixed value whose value range is [−1,1], and a is a fixed value whose value range is [−1,1].

9. The method according to claim 5, wherein a polarization weight of an $i^{th}$ polarized channel in the first sequence is $W_i=\Sigma_{j=0}^{n-1}B_j*(2^{j*\alpha_j}+b_j)^{\gamma j}$, and the first difference is $\Delta W_n=(2^{n*\alpha_n}+b_n)^{\gamma n}$;
wherein i is an index of a polarized channel, i is an integer greater than or equal to 0 and less than N, $i \triangleq B_{n-1}B_{n-2}\ldots B_0$, $B_j \in \{0,1\}$, $j \in \{0,1,\ldots,n-1\}$, $n=\log_2(N)$, $\beta$ and $\theta$ are fixed values whose value ranges are [0,2], $\alpha$ and $\gamma$ are fixed values whose value ranges satisfy $\alpha \times \gamma \in [0,2]$, b is a fixed value whose value range is [−1,1], and a is a fixed value whose value range is [−1,1].

10. The method according to claim 5, wherein a polarization weight of an $i^{th}$ polarized channel in the first sequence is $W_i=\Sigma_{j=0}^{n-1}B_j*(\beta^j+\alpha*\theta^j)$, and the first difference is $\Delta W_n=(\beta)^n+\alpha*(\theta)^n$;
wherein i is an index of a polarized channel, i is an integer greater than or equal to o and less than N, $i \triangleq B_{n-1}B_{n-2}\ldots B_0$, $B_j \in \{0,1\}$, $j \in \{0,1,\ldots,n-1\}$, $n=\log_2(N)$, $\beta$ and $\theta$ are fixed values whose value ranges are [0,2], $\alpha$ and $\gamma$ are fixed values whose value ranges satisfy $\alpha \times \gamma \in [0,2]$, b is a fixed value whose value range is [−1,1], and a is a fixed value whose value range is [−1,1].

11. The method according to claim 5, wherein a polarization weight of an $i^{th}$ polarized channel in the first sequence is $W_i=\Sigma_{j=0}^{n-1}B_j*((\beta_j)^j+\alpha_j*(\theta_j)^j)$, and the first difference is $\Delta W_n=(\beta_n)^n+\alpha_n*(\theta_n)^n$;
wherein i is an index of a polarized channel, i is an integer greater than or equal to o and less than N, $i \triangleq B_{n-1}B_{n-2}\ldots B_0$, $B_j \in \{0,1\}$, $j \in \{0,1,\ldots,n-1\}$, $n=\log_2(N)$, $\beta$ and $\theta$ are fixed values whose value ranges are [0,2], $\alpha$ and $\gamma$ are fixed values whose value ranges satisfy $\alpha \times \gamma \in [0,2]$, b is a fixed value whose value range is [−1,1], and a is a fixed value whose value range is [−1,1].

* * * * *

UNITED STATES PATENT AND TRADEMARK OFFICE
CERTIFICATE OF CORRECTION

PATENT NO. : 11,115,054 B2
APPLICATION NO. : 16/688100
DATED : September 7, 2021
INVENTOR(S) : Gongzheng Zhang et al.

Page 1 of 1

It is certified that error appears in the above-identified patent and that said Letters Patent is hereby corrected as shown below:

In the Claims

Claim 3, Column 28, Line 59; delete "i" after "N-1".

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*